United States Patent
Tamura et al.

(10) Patent No.: US 9,997,650 B2
(45) Date of Patent: Jun. 12, 2018

(54) SOLAR CELL, MANUFACTURING METHOD THEREOF, AND SOLAR CELL MODULE

(71) Applicant: MITSUBISHI ELECTRIC CORPORATION, Chiyoda-ku, Tokyo (JP)

(72) Inventors: Norihiro Tamura, Tokyo (JP); Hayato Kohata, Tokyo (JP); Atsuro Hama, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days. days.

(21) Appl. No.: 15/032,171

(22) PCT Filed: Nov. 7, 2013

(86) PCT No.: PCT/JP2013/080165
§ 371 (c)(1),
(2) Date: Apr. 26, 2016

(87) PCT Pub. No.: WO2015/068248
PCT Pub. Date: May 14, 2015

(65) Prior Publication Data
US 2016/0260852 A1    Sep. 8, 2016

(51) Int. Cl.
*H01L 31/00* (2006.01)
*H01L 21/00* (2006.01)
(Continued)

(52) U.S. Cl.
CPC .......... *H01L 31/022433* (2013.01); *H01L 31/022441* (2013.01); *H01L 31/068* (2013.01);
(Continued)

(58) Field of Classification Search
CPC ............................................. H01L 31/022433
See application file for complete search history.

(56) References Cited

U.S. PATENT DOCUMENTS 4,171,989 A * 10/1979 Pryor ................ H01L 31/02243
  136/256
4,540,843 A *  9/1985 Gochermann .... H01L 31/02168
  136/244
(Continued)

FOREIGN PATENT DOCUMENTS

JP          2-177571 A    7/1990
JP      2010-208317 A    9/2010
(Continued)

OTHER PUBLICATIONS

International Search Report (PCT/ISA/210) dated Dec. 3, 2013, by the Japanese Patent Office as the International Searching Authority for International Application No. PCT/JP2013/080165.
(Continued)

*Primary Examiner* — Angelo Trivisonno
(74) *Attorney, Agent, or Firm* — Buchanan Ingersoll & Rooney PC

(57) ABSTRACT

A solar cell includes: a first-conductivity-type semiconductor substrate that includes an impurity diffusion layer on one surface side, which is a light receiving surface side, the impurity diffusion layer having a second-conductivity-type impurity element diffused therein; a plurality of linear light-receiving-surface-side electrodes that are a paste electrode that has a multi-layered structure, is formed by multilayer printing of an electrode material paste on the one surface side, and is electrically connected to the impurity diffusion layer and that extend in parallel in a specific direction in a plane direction of the semiconductor substrate; and a back-surface-side electrode that is formed on another surface side of the semiconductor substrate. In the light-receiving-surface-side electrodes, the light-receiving-surface-side electrodes get smaller in width as they get closer in a width direction of the light-receiving-surface-side electrodes to a specific reference position.

6 Claims, 12 Drawing Sheets

(51) Int. Cl.
*H01L 31/0224* (2006.01)
*H01L 31/068* (2012.01)
*H01L 31/18* (2006.01)

(52) U.S. Cl.
CPC ........ *H01L 31/1804* (2013.01); *Y02E 10/547* (2013.01); *Y02P 70/521* (2015.11)

(56) References Cited

U.S. PATENT DOCUMENTS

2009/0272419 A1* 11/2009 Sakamoto ......... H01L 31/02168
  136/244
2010/0229740 A1  9/2010 Mitta et al.
2014/0190563 A1* 7/2014 Tokuoka ........... H01L 31/02243
  136/256

FOREIGN PATENT DOCUMENTS

| | | | | |
|---|---|---|---|---|
| JP | 2011-240623 A | 12/2011 | | |
| JP | 2013-038431 A | 2/2013 | | |
| JP | 2013-098241 A | 5/2013 | | |
| WO | WO-2013046351 A1 * | 4/2013 | ..... | H01L 31/022433 |
| WO | WO 2015/068247 A1 | 5/2015 | | |

OTHER PUBLICATIONS

Written Opinion (PCT/ISA/237) dated Dec. 3, 2013, by the Japanese Patent Office as the International Searching Authority for International Application No. PCT/JP2013/080165.

* cited by examiner

SOLAR CELL, MANUFACTURING METHOD THEREOF, AND SOLAR CELL MODULE

FIELD

The present invention relates to a solar cell, a manufacturing method thereof, and a solar cell module.

BACKGROUND

A screen printing method that provides great cost advantages is typically used for forming the electrodes in bulk solar cells in which semiconductor crystal substrates are used. In the screen printing method, an electrode paste consisting of, for example, silver particles, a resin, glass frit, a solvent, and the like, is used. With the screen printing method, the electrode paste is applied to a printing mask that is formed with a predetermined pattern, and the electrode paste is transferred and thus printed onto a print substrate (semiconductor substrate) through the printing mask by moving a printing squeegee over the printing mask. Then, the electrode paste printed on the semiconductor substrate is fired at a predetermined temperature that is in accordance with the materials in the electrode paste, whereby an electrode having a desired pattern is obtained.

When an electrode of a solar cell is formed, it is necessary to reduce the electrode-area percentage of the area of the semiconductor substrate on the light receiving surface side in order to capture more solar light on the light receiving surface. Furthermore, it is necessary for forming an electrode having a low resistance to increase the cross-sectional area of the electrode. Thus, when an electrode of a solar cell is formed, it is necessary to form an electrode that has a small electrode width, a large electrode height, and a high aspect ratio.

One of the methods for obtaining an electrode having a high aspect ratio by using a screen printing method is to form a multi-layer electrode by printing an electrode paste a plurality of times. With this method, an electrode paste that is to be the first layer is first printed on the substrate and is then fired or dried at a predetermined temperature. Thereafter, an electrode paste that is to be the second layer is printed in a superposed manner on the electrode paste of the first layer and is then fired or dried again at a predetermined temperature. Superposition printing is then repeated until the desired electrode height is obtained, thereby forming a multi-layer electrode.

Moreover, there is a selective emitter structure as a solar cell structure in which an electrode portion is formed by using superposition printing. With this structure, in order to increase the photoelectric conversion efficiency of the solar cell, a highly doped layer (low-resistance diffusion layer, hereinafter, sometimes referred to as a terrace) is formed in a region larger than the electrode on the light receiving surface side of the semiconductor substrate and thus the sheet resistance is reduced, thereby increasing the conductivity. Moreover, a low doped layer (high-resistance diffusion layer) is formed in the region other than the terrace on the light receiving surface side of the semiconductor substrate, thereby inhibiting the recombination of electrons. When the selective emitter structure is used, a light-receiving-surface-side electrode is formed by printing an electrode paste for forming the light-receiving-surface-side electrode on the low-resistance diffusion layer in a superposed manner.

Typically, when superposition printing of an electrode paste is performed, an alignment mark having a specific shape is used. For example, when an electrode paste is printed twice in a superposed manner, the shape data and positional data on the alignment mark of the second layer are registered in advance as a reference image in an image printing apparatus. Then, at the same time as the printed material (electrode paste) of the first layer is printed on the surface of the semiconductor substrate, an alignment mark that has the same shape as the alignment mark described above is printed on the surface of the semiconductor substrate.

Next, when an electrode paste of the second layer is printed, the printing stage is first finely adjusted so that the positional data on the alignment mark of the second layer stored in advance in the image printing apparatus matches the positional data on the alignment mark that has the same shape and is printed together with the electrode paste of the first layer, and then the electrode paste of the second layer is printed. At this point in time, the print position of the electrode paste of the second layer to be superposed on the electrode paste of the first layer is aligned with reference to the positioning reference position that is determined in accordance with the position of the alignment mark. This operation is repeated a given number of times to form an electrode portion. By repeating this operation a given number of times for superposing an electrode paste, an electrode is formed.

When an electrode is formed by performing such superposition printing, if the electrode paste portion (upper-layer electrode paste portion) to be printed next protrudes from the low-resistance diffusion layer (terrace) or the electrode paste portion (lower-layer electrode paste portion) that is printed first (printing misalignment), the photoelectric conversion efficiency of the solar cell is reduced. In other words, if the light-receiving-surface-side electrode protrudes from the low-resistance diffusion layer (terrace) and overlaps with the high-resistance diffusion layer, the contact resistance between the light-receiving-surface-side electrode and the substrate increases and thus the properties of the solar cell are reduced. As a result, the photoelectric conversion efficiency of the solar cell is reduced. Moreover, if the upper-layer electrode paste portion protrudes from the lower-layer electrode paste portion, the light receiving area is reduced. As a result, the photoelectric conversion efficiency of the solar cell is reduced. Thus, high superposition printing accuracy is required between the lower-layer electrode paste portion and the upper-layer electrode paste portion. Therefore, it is important to reduce any error that affects the high superposition printing accuracy.

In practice, however, it is not possible to eliminate all errors in superposition printing accuracy. Thus, it is also important to address errors that actually occur by providing a margin such that the superposition itself does not fail.

There are various factors that cause an error in superposition printing accuracy, such as a design error and a manufacturing error. However, an error in superposition printing accuracy has a tendency to have a correlation with a factor that is a positional relation with respect to a specific point, e.g., a tendency to have a correlation with the distance from the printing reference point that is used when printing is performed. Such factors include extension and a rotation error of a printing mask because of the repeated use of the printing mask. All of the errors increase or decrease depending on the distance from the reference point that is used as a reference when print positioning is performed.

The former error occurs because some of the elastic deformation of the screen remain, i.e., becomes irreversible, when the printing mask is repeatedly used, and the deformation rate per unit length essentially has a correlation with the distance from the reference point. The latter error is an error in the angle in the rotation direction that the whole pattern of the superposed electrode pastes may have, and this error is proportional to the angular error that occurs and to the distance from the reference point to each point. These errors are typically small at a point close to the reference point and large at a point away from the reference point. Because the errors have such characteristics, there is a risk of dramatically increasing the errors depending on the location; therefore, it is important to take appropriate measures to deal with these errors compared with other kinds of error factors.

In view of such a problem, for example, Patent Literature 1 proposes a method of reducing extension and distortion of a printing mask. In Patent Literature 1, the percentage of the area of a screen mesh made of a rigid material, such as a metal, in the whole area of the screen mesh is set to 40% or lower in the combination printing mask having a screen mesh made of a synthetic resin and the screen mesh made of a rigid material, thereby reducing extension, distortion, and the like of the printing mask that occurs as the number of times printing is performed increases. The purpose of this method is to eliminate the errors themselves.

CITATION LIST

Patent Literature

Patent Literature 1: Japanese Patent Application Laid-open No. 2011-240623

SUMMARY

Technical Problem

However, there has been a problem in that, with the method proposed in Patent Literature 1 described above, extension and distortion of the printing mask cannot be completely prevented and the printing mask extends with repeated use.

As described above, when superposition printing is repeated by using a screen printing method, printing errors occur because of, for example, extension and distortion of the printing mask or an angular error. The low-resistance diffusion layer (terrace) or the lower-layer electrode paste portion and the upper-layer electrode paste portion are positioned by aligning them with reference to the positioning reference point. Therefore, for example, even when the printing mask extends or is distorted, the superposition printing accuracy is still high and printing misalignment of the upper-layer electrode paste portion is small on the positioning reference point side, i.e., at a position near the positioning reference point. However, the displacement of the print position of the upper-layer electrode paste portion gradually increases because of these errors as the upper-layer electrode paste portion becomes further away from the positioning reference point. Therefore, the risk of printing misalignment increases.

A light-receiving-surface-side electrode of a solar cell is typically composed of a few bus electrodes and several grid electrodes. With the conventional technologies, the low-resistance diffusion layer (terrace) or the lower-layer electrode corresponding to the portion under the grid electrodes is printed such that it has a uniform printing width. Accordingly, when the width of the low-resistance diffusion layer (terrace) or the lower-layer electrode paste portion is reduced, printing misalignment occurs in a portion distant from the positioning reference point and thus superposition itself fails. In such a case, the properties of the solar cell are reduced. Providing a large margin for preventing such printing misalignment however produces constraints. Therefore, even if there is room for thinning of the low-resistance diffusion layer (terrace) or the lower-layer electrode paste portion on the positioning reference point side, it is still necessary to provide a redundant printing width for the low-resistance diffusion layer (terrace) or the lower-layer electrode paste portion.

The redundant width portion of the low-resistance diffusion layer, i.e., the portion that protrudes from the light-receiving-surface-side electrode, becomes a factor in increasing the recombination of electrons in the semiconductor substrate. This causes a reduction in the photoelectric conversion efficiency of the solar cell. Moreover, the redundant width portion of the lower-layer electrode paste portion becomes a factor in increasing the electrode area of the semiconductor substrate on the light receiving surface side. This causes a reduction in the photoelectric conversion efficiency of the solar cell.

The present invention has been achieved in view of the above and an object of the present invention is to provide a solar cell, a manufacturing method thereof, and a solar cell module that prevent printing misalignment of an electrode from occurring and have excellent photoelectric conversion efficiency.

Solution to Problem

In order to solve the above problems and achieve the object, a solar cell according to an aspect of the present invention includes: a first-conductivity-type semiconductor substrate that includes an impurity diffusion layer on one surface side, which is a light receiving surface side, the impurity diffusion layer having a second-conductivity-type impurity element diffused therein; a plurality of linear light-receiving-surface-side electrodes that are a paste electrode that has a multi-layered structure, is formed by multi-layer printing of an electrode material paste on the one surface side, and is electrically connected to the impurity diffusion layer and that extend in parallel in a specific direction in a plane direction of the semiconductor substrate; and a back-surface-side electrode that is formed on another surface side of the semiconductor substrate, wherein in the light-receiving-surface-side electrodes, the light-receiving-surface-side electrodes get smaller in width as the light-receiving-surface-side electrodes get closer in a width direction of the light-receiving-surface-side electrodes to a specific reference position.

Advantageous Effects of Invention

According to the present invention, an effect is obtained where a solar cell is obtained that prevents printing misalignment of an electrode from occurring and has excellent photoelectric conversion efficiency.

BRIEF DESCRIPTION OF DRAWINGS

FIG. 1-2 is a diagram illustrating the configuration of the solar cell according to the first embodiment of the present invention and is a bottom view of the solar cell when viewed from the back surface (surface opposite to the light receiving surface) side.

FIG. 1-3 is a diagram illustrating the configuration of the solar cell according to the first embodiment of the present invention and is a cross-sectional view of the relevant parts of the solar cell in the A-A direction in FIG. 1-1.

FIG. 2-1 is a cross-sectional view explaining an example of a manufacturing process of the solar cell according to the first embodiment of the present invention.

FIG. 2-2 is a cross-sectional view explaining an example of the manufacturing process of the solar cell according to the first embodiment of the present invention.

FIG. 2-3 is a cross-sectional view explaining an example of the manufacturing process of the solar cell according to the first embodiment of the present invention.

FIG. 2-4 is a cross-sectional view explaining an example of the manufacturing process of the solar cell according to the first embodiment of the present invention.

FIG. 2-5 is a cross-sectional view explaining an example of the manufacturing process of the solar cell according to the first embodiment of the present invention.

FIG. 2-6 is a cross-sectional view explaining an example of the manufacturing process of the solar cell according to the first embodiment of the present invention.

FIG. 2-7 is a cross-sectional view explaining an example of the manufacturing process of the solar cell according to the first embodiment of the present invention.

FIG. 2-8 is a cross-sectional view explaining an example of the manufacturing process of the solar cell according to the first embodiment of the present invention.

FIG. 2-9 is a cross-sectional view explaining an example of the manufacturing process of the solar cell according to the first embodiment of the present invention.

FIG. 3-1 is a plan view illustrating a state where an n-type doping paste is printed on one surface side of a semiconductor substrate.

FIG. 3-2 is an enlarged view illustrating the relevant parts in specific regions in FIG. 3-1.

FIG. 4 is a schematic diagram illustrating a schematic configuration of a screen printing apparatus that can perform superposition printing and that is used for printing a paste in the first embodiment.

FIG. 5 is a diagram illustrating alignment mark portions registered in an image processing apparatus as a reference image used for positioning the semiconductor substrate.

FIG. 6-1 is a plan view illustrating a state where a first n-type impurity diffusion layer is formed on one surface side of the semiconductor substrate.

FIG. 6-2 is an enlarged view illustrating the relevant parts in the specific regions in FIG. 6-1.

FIG. 7-1 is a plan view illustrating a state where a silver paste is printed on one surface side of the semiconductor substrate.

FIG. 7-2 is an enlarged view illustrating the relevant parts in the specific regions in FIG. 7-1.

FIG. 8-1 is a plan view illustrating another state where the first n-type impurity diffusion layer is formed on one surface side of the semiconductor substrate.

FIG. 8-2 is an enlarged view illustrating the relevant parts in specific regions in FIG. 8-1.

FIG. 8-3 is a plan view illustrating a state where a silver paste is printed in the specific region in FIG. 8-1.

FIG. 9-1 is a plan view illustrating a state where a silver paste of the first layer is printed on one surface side of the semiconductor substrate.

FIG. 9-2 is an enlarged view illustrating the relevant parts in the specific regions in FIG. 9-1.

FIG. 10-1 is a plan view illustrating a state where a silver paste of the second layer is printed on one surface side of the semiconductor substrate.

FIG. 10-2 is an enlarged view illustrating the relevant parts in the specific regions in FIG. 10-1.

DESCRIPTION OF EMBODIMENTS

Figure 1:
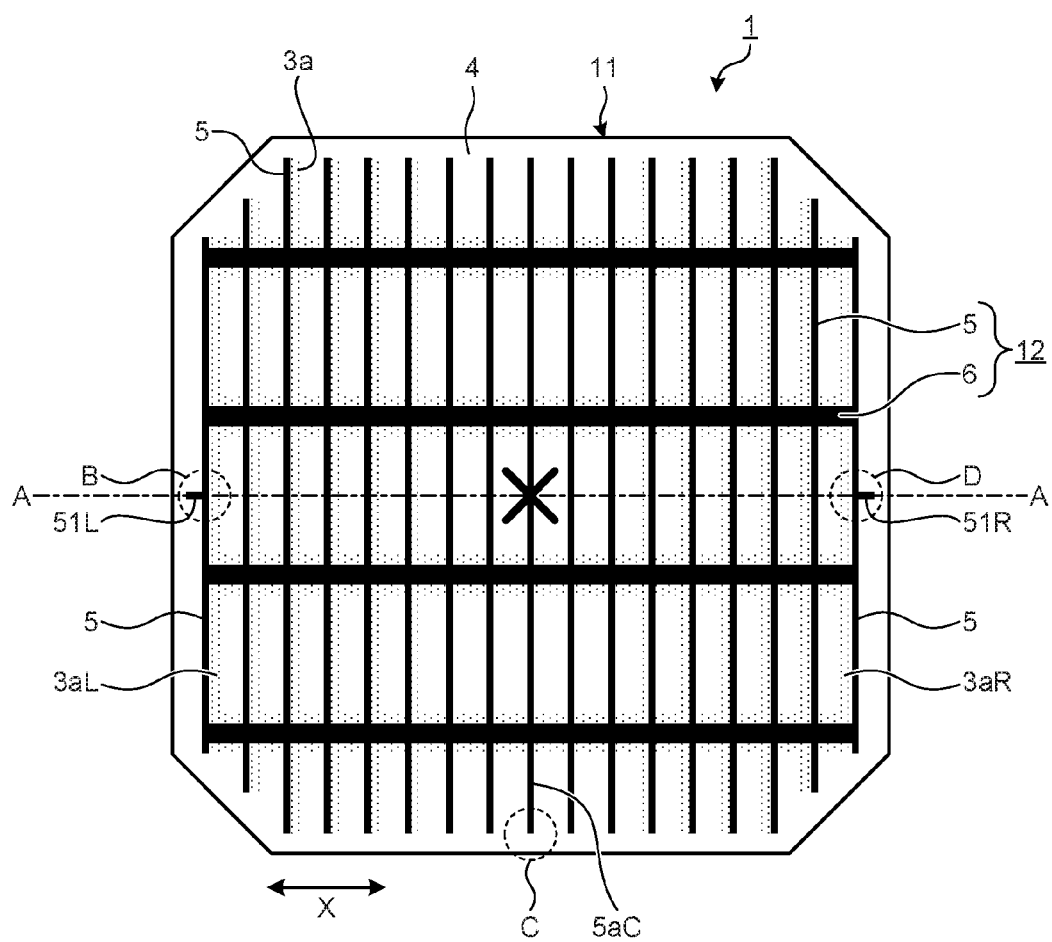
FIG. 1-1 is a diagram illustrating the configuration of a solar cell according to a first embodiment of the present invention and is a top view of the solar cell when viewed from the light receiving surface side.

Exemplary embodiments of a solar cell, a manufacturing method thereof, and a solar cell module according to the present invention will be explained below in detail with reference to the drawings. The present invention is not limited to the following descriptions and can be modified as appropriate without departing from the scope of the present invention. In the drawings explained below, for ease of understanding, the scales of respective components may be shown differently from the scales in reality. The same holds true for the relations between the drawings. Hatching is applied even to plan views in some cases in order to facilitate visualization of the drawings.

First Embodiment

Figures 1, 2:
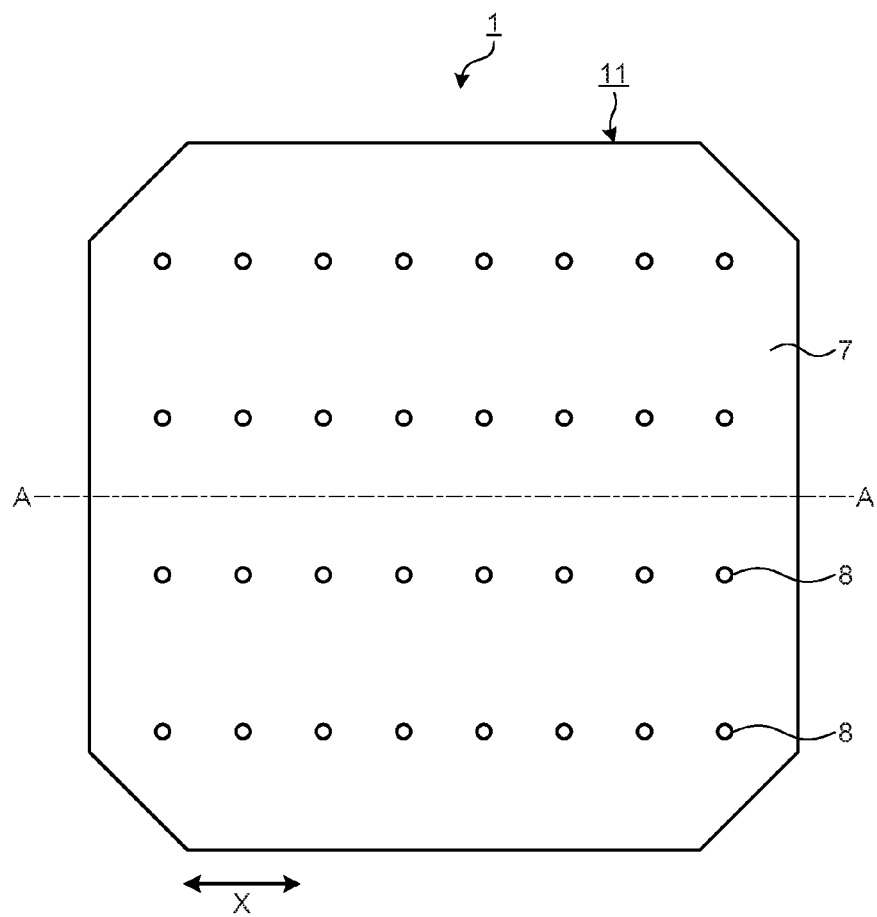
Figures 1, 2, 3:
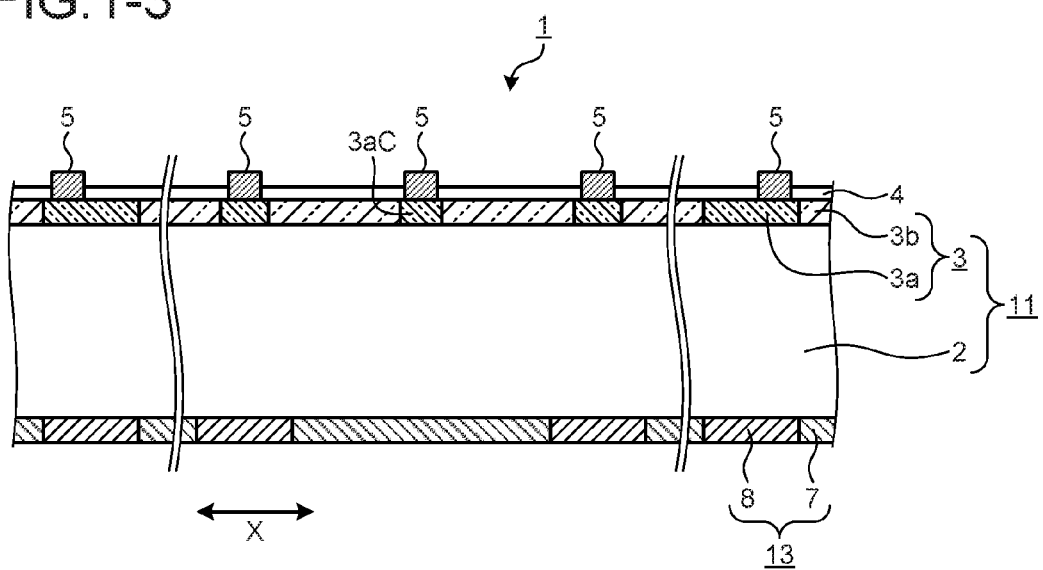

FIG. 1-1 to FIG. 1-3 are diagrams illustrating the configuration of a solar cell according to a first embodiment, where FIG. 1-1 is a top view of the solar cell when viewed from the light receiving surface side, FIG. 1-2 is a bottom view of the solar cell when viewed from the back surface (surface opposite to the light receiving surface) side, and FIG. 1-3 is a cross-sectional view of the relevant parts of the solar cell in the A-A direction in FIG. 1-1.

In a solar cell 1 according to the present embodiment, on the light receiving surface side of a p-type polycrystalline silicon substrate that is a semiconductor substrate 2 having a first conductivity type, an n-type impurity diffusion layer 3 having a second conductivity type is formed with a thickness of about 0.2 micrometers by phosphorus diffusion so as to obtain diode characteristics, thereby forming a semiconductor substrate 11 that has a pn junction. An anti-reflective film 4 made from a silicon nitride film (SiN film) is formed on the n-type impurity diffusion layer 3. The semiconductor substrate 2 having a first conductivity type is not limited to the p-type polycrystalline silicon substrate and may be a p-type single crystal silicon substrate, an n-type polycrystalline silicon substrate, an n-type single crystal silicon substrate, or other semiconductor substrates that can be used as a solar cell substrate.

Microasperities (not illustrated) are formed as a texture structure with a depth of about 10 micrometers on the surface on the light receiving surface side of the semiconductor substrate 11 (the n-type impurity diffusion layer 3) so as to increase the light use efficiency. The microasperities have a structure that increases the area by which light from the outside is absorbed on the light receiving surface, reduces the reflectance on the light receiving surface, and confines light. The anti-reflective film 4 is made from an insulating film, such as a silicon nitride film (SiN film), a silicon oxide film ($SiO_2$ film), and a titanium oxide film ($TiO_2$ film).

A plurality of long and thin linear-shaped surface silver grid electrodes 5 are provided in parallel on the light receiving surface side of the semiconductor substrate 11 and thick surface silver bus electrodes 6, which are in electrical communication with the surface silver grid electrodes 5, are provided such that they are substantially perpendicular to the surface silver grid electrodes 5. The surface silver grid electrodes 5 and the surface silver bus electrodes 6 are electrically connected, on their bottom surface portions, to the n-type impurity diffusion layer 3. The surface silver grid electrodes 5 and the surface silver bus electrodes 6 are made from a silver material. The surface silver grid electrodes 5 and the surface silver bus electrodes 6 are formed such that they are surrounded by the anti-reflective film 4.

The surface silver grid electrodes 5 have a predetermined width and are disposed substantially in parallel with each other at predetermined intervals. The surface silver grid electrodes 5 collect electricity generated in the semiconductor substrate 11. The surface silver bus electrodes 6 have a predetermined width larger than that of the surface silver grid electrodes 5. For example, two to four surface silver bus electrodes 6 are disposed per solar cell. The surface silver bus electrodes 6 extract the electricity collected by the surface silver grid electrodes 5 to the outside. In the first embodiment, the number of the surface silver bus electrodes 6 is four. A light-receiving-surface-side electrode 12, which is a comb-shaped paste electrode (first electrode), includes the surface silver grid electrodes 5 and the surface silver bus electrodes 6. Because the light-receiving-surface-side electrode 12 blocks solar light incident on the semiconductor substrate 11, it is desirable from the perspective of improving the power generation efficiency that the area of the light-receiving-surface-side electrode 12 is reduced as much as possible.

In the solar cell 1, a selective emitter structure is formed by forming two kinds of layers as the n-type impurity diffusion layer 3. Specifically, in the surface layer portion on the light receiving surface side of the semiconductor substrate 11, a first n-type impurity diffusion layer 3a is formed in the lower region under the light-receiving-surface-side electrode 12 and the region near the lower region. The first n-type impurity diffusion layer 3a is a high-concentration impurity diffusion layer (low-resistance diffusion layer) in which an n-type impurity element is diffused at a high concentration (first concentration). The light-receiving-surface-side electrode 12 is formed on the first n-type impurity diffusion layer 3a such that it does not protrude from the first n-type impurity diffusion layer 3a. All the surface silver grid electrodes 5 are formed with the same width on the first n-type impurity diffusion layer 3a.

Moreover, in the surface layer portion on the light receiving surface side of the semiconductor substrate 11, a second n-type impurity diffusion layer 3b is formed in the region in which the first n-type impurity diffusion layer 3a is not formed. The second n-type impurity diffusion layer 3b is a low-concentration impurity diffusion layer (high-resistance diffusion layer) in which an n-type impurity element is diffused at a low concentration (second concentration), which is lower than the first concentration. With such a selective emitter structure, the contact resistance between the light-receiving-surface-side electrode 12 and the n-type impurity diffusion layer 3 can be reduced; therefore, the photoelectric conversion efficiency of the solar cell can be improved.

Furthermore, on the whole back surface (surface opposite to the light receiving surface) of the semiconductor substrate 11, a back aluminum electrode 7 made from an aluminum material is provided and a back silver electrode 8 made from a silver material is provided as an extraction electrode such that it extends, for example, in substantially the same direction as the surface silver grid electrodes 5. The back aluminum electrode 7 and the back silver electrode 8 form a back-surface-side electrode 13, which is a second electrode.

An alloy layer (not illustrated) formed by firing aluminum (Al) and silicon (Si) is formed in the surface layer portion on the back surface side of the semiconductor substrate 11, i.e., the portion under the back aluminum electrode 7, and a p+ layer (BSF: Back Surface Field) (not illustrated) containing a high-concentration impurity by aluminum diffusion is formed under the alloy layer. The p+ layer (BSF) is formed in order to obtain the BSF effect and it increases the electron concentration in the p-type layer (the semiconductor substrate 2) with the electric field on the band structure so that electrons in the p-type layer (the semiconductor substrate 2) do not disappear.

With the solar cell 1 configured as above, when the pn junction surface (junction surface of the semiconductor substrate 2 and the n-type impurity diffusion layer 3) of the semiconductor substrate 11 is irradiated with solar light from the light receiving surface side of the solar cell 1, holes and electrons are generated. Because of the electric field of the pn junction portion, the generated electrons move toward the n-type impurity diffusion layer 3 and the holes move toward the p+ layer. Accordingly, electrons become excessive in the n-type impurity diffusion layer 3 and holes become excessive in the p+ layer, thereby generating photovoltaic power. This photovoltaic power is generated in a direction that forward biases the pn junction; therefore, the light-receiving-surface-side electrode 12 connected to the n-type impurity diffusion layer 3 becomes a negative electrode and the back aluminum electrode 7 connected to the p+ layer becomes a positive electrode. As a result, an electric current flows to an external circuit (not illustrated).

With the solar cell 1 according to the first embodiment described above, in the pattern of the first n-type impurity diffusion layer 3a, the comb-tooth-shaped patterns corresponding to the comb-tooth-shaped surface silver grid electrodes 5 get thinner as they get closer in the X direction in FIG. 1-1 to the positioning reference point. FIG. 1-1 illustrates the first n-type impurity diffusion layer 3a through the anti-reflective film 4. In FIG. 1-1, the positioning reference point is indicated by a cross mark (hereinafter, the same applies to the drawings). In the present embodiment, the central portion within the surface of the semiconductor substrate 11 is the positioning reference point. Therefore, the width of a comb-tooth-shaped pattern 3aL of the first n-type impurity diffusion layer 3a located at the left end in the X direction in FIG. 1-1 and the width of a comb-tooth-shaped pattern 3aR of the first n-type impurity diffusion layer 3a located at the right end in the X direction in FIG. 1-1 are the largest. The width of a comb-tooth-shaped pattern 3aC of the first n-type impurity diffusion layer 3a located in the center in the X direction in FIG. 1-1 and FIG. 1-3 is the smallest. Details of the positioning reference point and the patterns of the first n-type impurity diffusion layer 3a will be described later.

Moreover, all the surface silver grid electrodes 5 are formed with the same width. The intervals at which the adjacent surface silver grid electrodes 5 are disposed are all the same. All the surface silver grid electrodes 5 are formed such that they do not protrude from the first n-type impurity diffusion layer 3a formed under the surface silver grid electrodes 5.

In the surface silver grid electrode 5 at the left end in the X direction in FIG. 1-1, an alignment mark portion 51L is printed and formed with a silver paste in a region B in the central portion in the extending direction. In the surface silver grid electrode 5 at the right end in the X direction in FIG. 1-1, an alignment mark portion 51R is printed and formed with a silver paste in a region D in the central portion in the extending direction.

Hereinafter, an explanation, with reference to the drawings, will be given of a manufacturing method of the solar cell 1 according to the present embodiment configured as above. FIG. 2-1 to FIG. 2-9 are cross-sectional views explaining an example of the manufacturing process of the solar cell 1 according to the first embodiment of the present invention.

First, a p-type single crystal silicon substrate with a thickness of, for example, a few hundred micrometers is prepared as the semiconductor substrate 2 and substrate cleaning is performed (FIG. 2-1). Because the p-type single crystal silicon substrate is manufactured by slicing, with a wire saw, an ingot formed by cooling and solidifying molten silicon, damage caused by the slicing remains on the surface. Thus, the p-type single crystal silicon substrate is immersed in acid, such as hydrofluoric acid, or a heated alkaline solution, such as aqueous sodium hydroxide solution, to etch the surface thereof by a thickness of about 15 micrometers, thereby removing the damaged region that is generated when the silicon substrate is sliced and is present near the surface of the p-type single crystal silicon substrate. Then, the surface of the p-type single crystal silicon substrate is cleaned with hydrofluoric acid. Thereafter, the surface of the p-type single crystal silicon substrate is cleaned with pure water.

Subsequent to the damage removal, anisotropic etching of the p-type single crystal silicon substrate is performed by immersing the p-type single crystal silicon substrate in a mixed solution of, for example, sodium hydroxide and IPA (isopropyl alcohol). Accordingly, a texture structure formed with microasperities (not illustrated) with a depth of, for example, about 10 micrometers is formed on the surface on the light receiving surface side of the p-type single crystal silicon substrate. By providing such a texture structure on the light receiving surface side of the p-type single crystal silicon substrate, it is possible to cause multiple reflection of light on the front surface side of the solar cell 1 and efficiently absorb light incident on the solar cell 1 into the semiconductor substrate 11. Therefore, the reflectance can be effectively reduced and the conversion efficiency can be improved. When removal of the damaged layer and formation of the texture structure are performed by using an alkaline solution, continuous processing is performed in some cases by adjusting the concentration of the alkaline solution according to individual purposes. Microasperities with a depth of about 1 micrometer to 3 micrometers may be formed on the surface of a p-type polycrystalline silicon substrate by performing a dry etching process, such as reactive ion etching (RIE: Reactive Ion Etching).

Next, a pn junction is formed in the semiconductor substrate 2 by performing a diffusion process. Specifically, for example, a V group element, such as phosphorus (P), is diffused into the semiconductor substrate 2 to form the n-type impurity diffusion layer 3 with a thickness of a few hundred nanometers in the semiconductor substrate 2.

First, on one surface side to be the light receiving surface side of the semiconductor substrate 2, an n-type doping paste 21 is applied to the region in which the light-receiving-surface-side electrode 12 is to be formed in the subsequent processes (FIG. 2-2). The n-type doping paste 21 is composed of a paste that contains an organic solvent and a resin containing a few percentage of a V group element, such as phosphorus (P), and its compound as an n-type doping material. In the present embodiment, the n-type doping paste 21 contains phosphorus (P) as a doping material. A screen printing method is, for example, used to apply the n-type doping paste 21.

The printing mask used for screen printing is such that a metal mesh is extended with a predetermined tension and supported within the printing mask frame made from, for example, an aluminum alloy. In other words, the printing mask frame is provided on the outer peripheral edge portion of the printing mask along the outer periphery of the printing mask and holds the metal mesh. The metal mesh is covered with a photosensitive resin film (emulsion) in the portion except for the openings corresponding to the printed pattern. The shape of the openings corresponds to the pattern of the first n-type impurity diffusion layer 3a, which is formed such that it includes the pattern of the light-receiving-surface-side electrode 12 in the plane direction of the semiconductor substrate 2.

The n-type doping paste 21 is printed in a comb shape as illustrated in FIG. 3-1 and FIG. 3-2. This comb-shaped pattern is a pattern that includes the pattern of the light-receiving-surface-side electrode 12 in the plane direction of the semiconductor substrate 2. The light-receiving-surface-side electrode 12 includes several surface silver grid electrodes 5 and a few surface silver bus electrodes 6, which are formed in the subsequent processes. In other words, this comb-shaped pattern includes a lower region under the light-receiving-surface-side electrode 12 and the peripheral region that extends from the lower region. FIG. 3-1 is a plan view illustrating a state where the n-type doping paste 21 is printed on one surface side of the semiconductor substrate 2. FIG. 3-2 is an enlarged view illustrating the relevant parts in a region B, a region C, and a region D in FIG. 3-1. In FIG. 3-2, (a) illustrates the region B, (b) illustrates the region C, and (c) illustrates the region D in an enlarged scale.

The n-type doping paste 21 is printed in a pattern in which the comb-tooth-shaped portions corresponding to the surface silver grid electrodes 5 get smaller in width as they get closer to a specific position in the width direction (X direction in FIG. 3-1) of the surface silver grid electrodes 5. In the first embodiment, in the printed pattern of the n-type doping paste 21, a comb-tooth-shaped printed pattern 21C (hereinafter, sometimes referred to as a central printed pattern 21C) of the n-type doping paste located in the center in the X direction in FIG. 3-1 is defined as a specific position. Other comb-tooth-shaped portions in the printed pattern of the n-type doping paste 21 are such that the comb-tooth-shaped printed patterns get thinner as they get closer in the X direction in FIG. 3-1 to the central printed pattern 21C. Therefore, the printing width of a comb-tooth-shaped printed pattern 21L (hereinafter, sometimes referred to as a left-end printed pattern 21L) of the n-type doping paste located at the left end in the X direction in FIG. 3-1 and a comb-tooth-shaped printed pattern 21R (hereinafter, sometimes referred to as a right-end printed pattern 21R) of the n-type doping paste located at the right end in the X direction are the largest. In other words, a width "a" of the left-end printed pattern 21L and the right-end printed pattern 21R is the largest. A width "b" of the central printed pattern 21C is the smallest.

When the n-type doping paste 21 is printed, as illustrated in FIG. 3-1 and FIG. 3-2, an alignment mark portion 22L is printed with the n-type doping paste 21 in the region B in the central portion in the extending direction of the left-end printed pattern 21L. The left-end printed pattern 21L is a comb-tooth-shaped portion located at the left end among the comb-tooth-shaped portions formed along a pair of opposing sides of the semiconductor substrate 2. The alignment mark portion 22L is printed with the n-type doping paste 21 in a specific shape, e.g., projecting from the left-end printed pattern 21L.

When the n-type doping paste 21 is printed, as illustrated in FIG. 3-1 and FIG. 3-2, an alignment mark portion 22R is printed with the n-type doping paste 21 in the region D in the central portion in the extending direction of the right-end printed pattern 21R. The right-end printed pattern 21R is a comb-tooth-shaped portion located at the right end among the comb-tooth-shaped portions formed along a pair of opposing sides of the semiconductor substrate 2. The alignment mark portion 22R is printed with the n-type doping paste 21 in a specific shape, e.g., projecting from the right-end printed pattern 21R.

The alignment mark portion 22L and the alignment mark portion 22R are used for accurately superposing the electrode on the doping paste printed portion in the subsequent electrode printing process. After the n-type doping paste 21 is printed, the semiconductor substrate 2 is put into a drying oven and the n-type doping paste 21 is dried at, for example, 250° C.

Figures 1, 2:
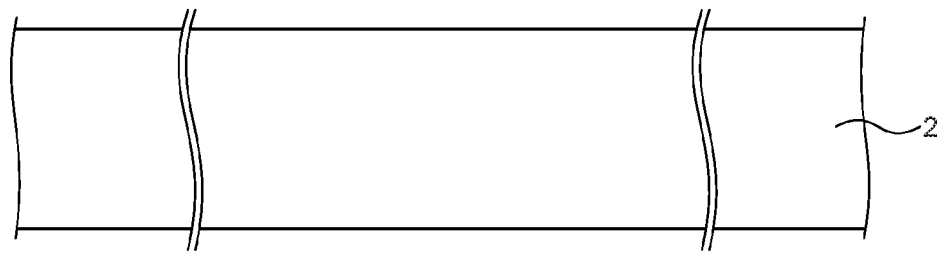
Figure 2:
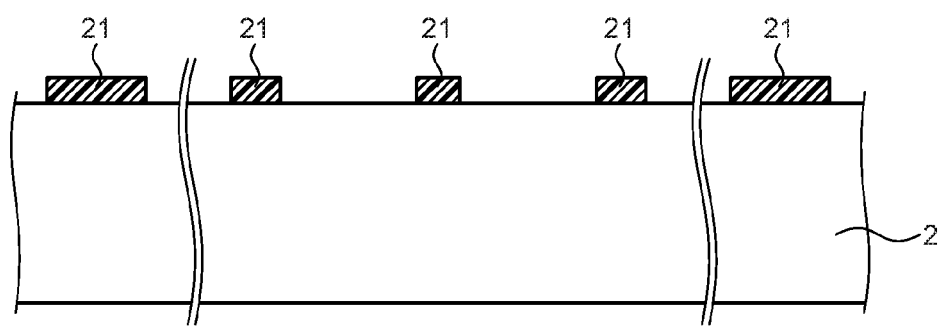
Figures 2, 3:
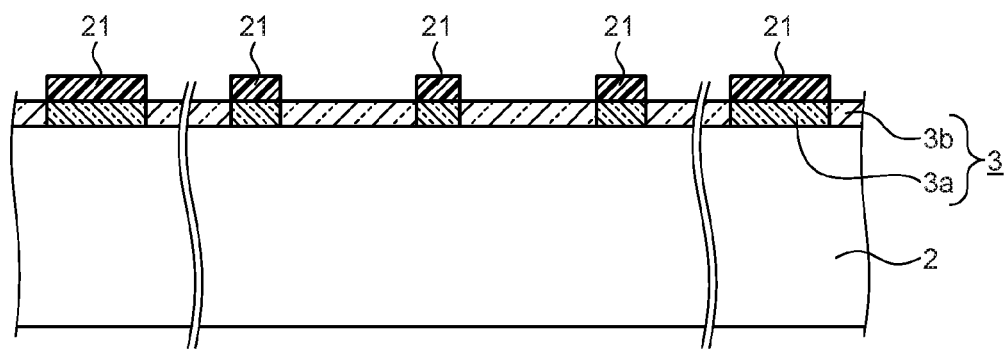
Figures 2, 3, 4:
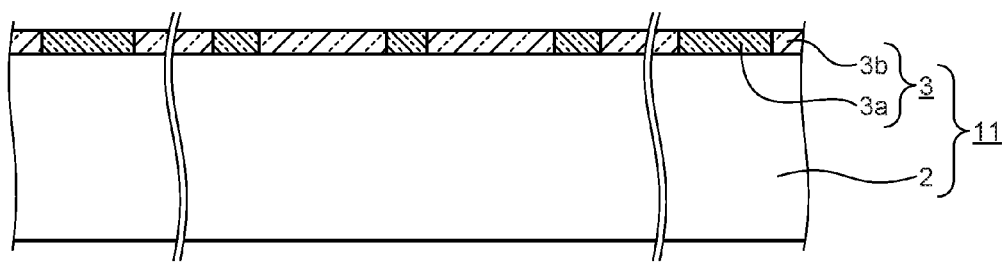

FIG. 4 is a schematic diagram illustrating a schematic configuration of a screen printing apparatus that can perform superposition printing and that is used for printing a paste in the first embodiment. In the screen printing apparatus, a print substrate 32 (the semiconductor substrate 2) is placed on a movable printing stage 31. The printing stage 31 can freely move in the X direction, Y direction, and θ direction in FIG. 4. The X direction corresponds to the X direction in FIG. 3-1. The X direction and the Y direction are directions that are orthogonal to each other in the plane direction of the printing stage 31. Normally, the square-shaped semiconductor substrate 2 is aligned such that the extending directions of two pairs of opposing sides match the X direction and the Y direction, respectively, and it is placed on the printing stage 31 with the printing side facing upward. The θ direction is a rotation direction of the printing stage 31 in the plane direction.

Figures 2, 3, 4, 5:
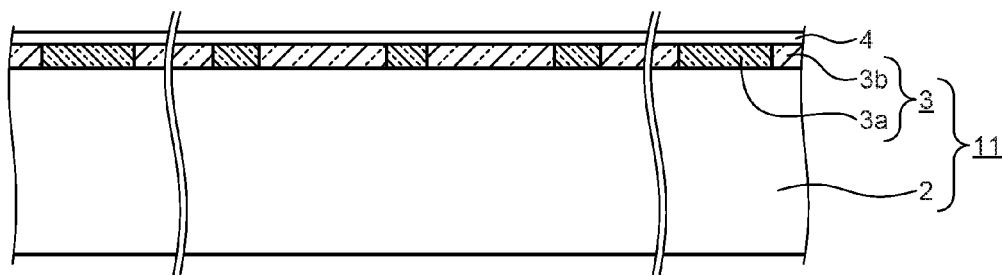

The alignment mark portion 22L and the alignment mark portion 22R are printed on one surface of the semiconductor substrate 2 as described above. In the screen printing apparatus, a stationary camera 33, which recognizes an alignment mark portion, is disposed over each of the alignment mark portion 22L and the alignment mark portion 22R. The stationary cameras 33 are connected to an image processing apparatus 34. The image processing apparatus 34 stores images captured by the stationary cameras 33. As illustrated in FIG. 5, in the image processing apparatus 34, shape data and positional data on an alignment mark portion 35L and an alignment mark portion 35R are registered in advance as a reference image 35 used for positioning the semiconductor substrate 2. The alignment mark portion 35L corresponds to the alignment mark portion 51L, which is printed simultaneously with an electrode paste that will be described later, and the alignment mark portion 35R corresponds to the alignment mark portion 51R, which is printed simultaneously with an electrode paste that will be described later. FIG. 5 is a diagram illustrating the alignment mark portions registered in the image processing apparatus 34 as the reference image 35 used for positioning the semiconductor substrate 2.

Next, the semiconductor substrate 2 to which the n-type doping paste 21 is applied is put into a thermal diffusion furnace and a thermal diffusion process of thermally diffusing a dopant (phosphorus) is performed. In this process, phosphorus is thermally diffused at a high temperature in phosphorus oxychloride ($POCl_3$) gas by using a vapor-phase diffusion method. The n-type doping paste 21 contains a dopant (phosphorus) at a concentration higher than that of phosphorus oxychloride ($POCl_3$) gas. Therefore, on one surface side of the semiconductor substrate 2, more dopant (phosphorus) is thermally diffused into the portion under the region in which the n-type doping paste 21 is printed than in other regions. Accordingly, a dopant (phosphorus) is thermally diffused at a high concentration (first concentration) from the n-type doping paste 21 into the region under the printed region of the n-type doping paste 21 on one surface side of the semiconductor substrate 2, thereby forming the first n-type impurity diffusion layer 3a (FIG. 2-3). In other words, the pattern of the first n-type impurity diffusion layer 3a on one surface side of the semiconductor substrate 2 corresponds to the printed pattern of the n-type doping paste 21 on one surface side of the semiconductor substrate 2.

With this thermal diffusion process, in the region excluding the printed region of the n-type doping paste 21 on the surface of the semiconductor substrate 2, i.e., the exposed region of the semiconductor substrate 2, a dopant (phosphorus) is thermally diffused at a concentration (second concentration) lower than that in the first n-type impurity diffusion layer 3a, thereby forming the second n-type impurity diffusion layer 3b (FIG. 2-3). Accordingly, a selective emitter structure composed of the first n-type impurity diffusion layer 3a and the second n-type impurity diffusion layer 3b is obtained as the n-type impurity diffusion layer 3 on the light receiving surface side of the semiconductor substrate 2. The sheet resistance of the semiconductor substrate 11 on the light receiving surface side is, for example, such that the sheet resistance of the first n-type impurity diffusion layer 3a to be the region under the light-receiving-surface-side electrode 12 is 20Ω/□ to 40Ω/□ and the sheet resistance of the second n-type impurity diffusion layer 3b to be the light receiving surface is 80Ω/□ to 120Ω/□.

Figures 2, 3, 4, 5, 6:
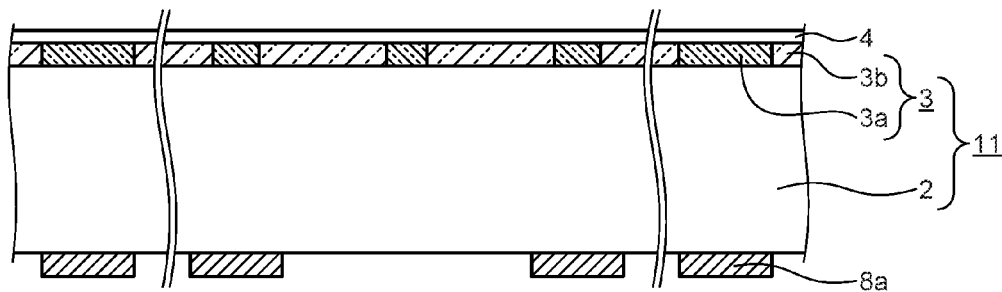

FIG. 6-1 is a plan view illustrating a state where the first n-type impurity diffusion layer 3a is formed on one surface side of the semiconductor substrate 2. FIG. 6-2 is an enlarged view illustrating the relevant parts in the region B, the region C, and the region D in FIG. 6-1. In FIG. 6-2, (a) illustrates the region B, (b) illustrates the region C, and (c) illustrates the region D in an enlarged scale. As illustrated in FIG. 6-1, the pattern of the first n-type impurity diffusion layer 3a on one surface side of the semiconductor substrate 2 corresponds to the printed pattern (comb-shaped) of the n-type doping paste 21 on one surface side of the semiconductor substrate 2.

Therefore, as illustrated in FIG. 6-2, the comb-tooth-shaped pattern 3aC (hereinafter, sometimes referred to as the central first n-type impurity diffusion layer 3aC) of the first n-type impurity diffusion layer 3a located in the center in the X direction in FIG. 6-1 is formed in the shape of the central printed pattern 21C. The comb-tooth-shaped pattern 3aL (hereinafter, sometimes referred to as the left-end first n-type impurity diffusion layer 3aL) of the first n-type impurity diffusion layer 3a located at the left end in the X direction in FIG. 6-1 is formed in the shape of the left-end printed pattern 21L. The comb-tooth-shaped pattern 3aR (hereinafter, sometimes referred to as the right-end first n-type impurity diffusion layer 3aR) of the first n-type impurity diffusion layer 3a located at the right end in the X direction in FIG. 6-1 is formed in the shape of the right-end printed pattern 21R.

Other comb-tooth-shaped portions in the pattern of the first n-type impurity diffusion layer 3a are such that the comb-tooth-shaped patterns get thinner as they get closer in the X direction in FIG. 6-1 to the central first n-type impurity diffusion layer 3aC. Therefore, the width "a" of the left-end first n-type impurity diffusion layer 3aL and the right-end first n-type impurity diffusion layer 3aR is the largest. The width "b" of the central first n-type impurity diffusion layer 3aC is the smallest. In the present embodiment, for example, the width "a" of the left-end first n-type impurity diffusion layer 3aL and the right-end first n-type impurity diffusion layer 3aR is 200 micrometers and the width "b" of the central first n-type impurity diffusion layer 3aC closest to the positioning reference point is 120 micrometers.

An alignment mark portion 41L of the first n-type impurity diffusion layer 3a is formed in the shape of the alignment mark portion 22L printed with the n-type doping paste 21. An alignment mark portion 41R of the first n-type impurity diffusion layer 3a is formed in the shape of the alignment mark portion 22R printed with the n-type doping paste 21.

The concentration of phosphorus to be diffused in this case can be controlled in accordance with the concentration of the dopant (phosphorus) in the n-type doping paste 21, the concentration and atmosphere temperature of phosphorus oxychloride ($POCl_3$) gas, and the heating time. A glassy (PSG: Phospho-Silicate Glass) layer (not illustrated) deposited on the surface during the diffusion process is formed on the surface of the semiconductor substrate 2 immediately after the thermal diffusion process.

Next, pn isolation is performed (not illustrated). Because the second n-type impurity diffusion layer 3b is formed uniformly on the surfaces of the semiconductor substrate 2, one surface side and the other surface side of the semiconductor substrate 2 are electrically connected to each other. Thus, when the back aluminum electrode 7 (p-type electrode) and the light-receiving-surface-side electrode 12 (n-type electrode) are formed in this state, the back aluminum electrode 7 (p-type electrode) and the light-receiving-surface-side electrode 12 (n-type electrode) are electrically connected. In order to interrupt this electrical connection, pn isolation is performed by removing the second n-type impurity diffusion layer 3b formed in the end surface region of the semiconductor substrate 2, e.g., by dry etching or using a laser.

Next, the semiconductor substrate 2 is immersed, for example, in a hydrofluoric acid solution and then undergoes a washing process so as to remove the glassy material formed on the surface of the semiconductor substrate 2 during the thermal diffusion process and the glassy material (a mass after a phosphorus compound is dissolved) that is a residue of the n-type doping paste 21 (FIG. 2-4). Accordingly, the semiconductor substrate 11 is obtained in which a pn junction is formed by the semiconductor substrate 2, which is the first-conductivity-type layer and is made from p-type silicon, and the n-type impurity diffusion layer 3, which is the second-conductivity-type layer and is formed on the light receiving surface side of the semiconductor substrate 2.

Next, a silicon nitride (SiN) film is, for example, formed with a uniform thickness (e.g., 60 nanometers to 80 nanometers) as the anti-reflective film 4 on the light receiving surface side (the n-type impurity diffusion layer 3 side) of the semiconductor substrate 11 (FIG. 2-5). The anti-reflective film 4 is formed by using a plasma CVD method and using a mixed gas of silane ($SiH_4$) gas and ammonia ($NH_3$) gas as a raw material.

Electrodes are then formed by screen printing. First, the back-surface-side electrode 13 (before firing) is formed by screen printing. Specifically, a back silver electrode, which is an external extraction electrode that ensures conduction to an external source, is formed by printing a silver paste 8a, which is an electrode material paste containing silver particles, on the back surface of the semiconductor substrate 11 in the desired back silver electrode pattern and drying the silver paste 8a (FIG. 2-6).

Next, an aluminum paste 7a, which is an electrode material paste containing aluminum particles, is applied to and printed on the back surface side of the semiconductor substrate 11 excluding the pattern portion of the back silver electrode 8 in the shape of the back aluminum electrode 7, and then the aluminum paste 7a is dried (FIG. 2-7).

Next, the light-receiving-surface-side electrode 12 (before firing) is formed by screen printing. Specifically, a silver paste 12a, which is an electrode material paste containing glass frit and silver particles, is applied to the anti-reflective film 4 on the light receiving surface of the semiconductor substrate 11 by screen printing in the shape of the surface silver grid electrodes 5 and the surface silver bus electrodes 6, and then the silver paste is dried (FIG. 2-8). In FIG. 2-8, only a silver paste 5a portion for forming the surface silver grid electrodes 5 of the silver paste 12a is illustrated.

Figures 2, 3, 4, 5, 6, 7:
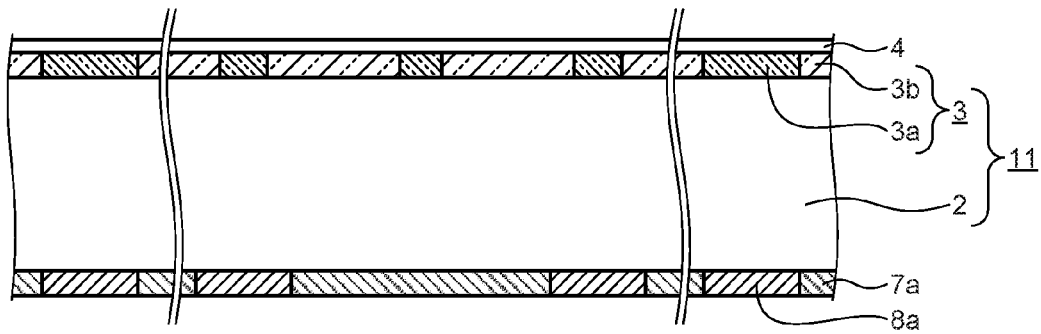

The silver paste for forming the light-receiving-surface-side electrode 12 is printed such that it is superposed on the doping paste printed portion on one surface side of the semiconductor substrate 11, i.e., the first n-type impurity diffusion layer 3a formed on one surface side of the semiconductor substrate 11. FIG. 7-1 is a plan view illustrating a state where the silver paste 12a is printed on one surface side of the semiconductor substrate 11. FIG. 7-2 is an enlarged view illustrating the relevant parts in the region B, the region C, and the region D in FIG. 7-1. In FIG. 7-2, (a) illustrates the region B, (b) illustrates the region C, and (c) illustrates the region D in an enlarged scale. The printed pattern of the silver paste is printed in a superposed manner on the first n-type impurity diffusion layer 3a in the following manner.

First, the printing stage 31 on which the semiconductor substrate 11 is placed is finely adjusted such that the position (data) of the alignment mark portion 35L registered in advance in the image processing apparatus 34 as the reference image 35 and the position (data) of the alignment mark portion 41L of the first n-type impurity diffusion layer 3a match within a predetermined error range. Moreover, the printing stage 31 on which the semiconductor substrate 11 is placed is finely adjusted such that the position (data) of the alignment mark portion 35R registered in advance in the image processing apparatus 34 as the reference image 35 and the position (data) of the alignment mark portion 41R of the first n-type impurity diffusion layer 3a match within a predetermined error range.

Then, as illustrated in FIG. 7-1 and FIG. 7-2, the silver paste 12a is printed on the first n-type impurity diffusion layer 3a. Therefore, as illustrated in FIG. 7-2, a comb-tooth-shaped printed pattern 5aC (hereinafter, sometimes referred to as a central printed pattern 5aC) of the surface silver grid electrode located in the center in the X direction in FIG. 7-1 is printed on the central first n-type impurity diffusion layer 3aC. A comb-tooth-shaped printed pattern 5aL (hereinafter, sometimes referred to as a left-end printed pattern 5aL) of the surface silver grid electrode located at the left end in the X direction in FIG. 7-1 is printed on the left-end first n-type impurity diffusion layer 3aL. A comb-tooth-shaped printed pattern 5aR (hereinafter, sometimes referred to as a right-end printed pattern 5aR) of the surface silver grid electrode located at the right end in the X direction in FIG. 7-1 is printed on the right-end first n-type impurity diffusion layer 3aR.

Other comb-tooth-shaped portions in the printed pattern of the silver paste 5a for forming the surface silver grid electrodes 5 are also printed on the comb-shaped first n-type impurity diffusion layer 3a in a similar manner. Moreover, the silver paste 12a for forming the surface silver bus electrodes 6 is also printed on the corresponding first n-type impurity diffusion layer 3a. The silver paste for the surface silver grid electrodes is printed such that it has a uniform printing width "c". In the first embodiment, the printing width "c" of the silver paste for the surface silver grid electrodes is, for example, 100 micrometers. The silver paste for the surface silver grid electrodes 5 is printed such that the printing intervals between the surface silver grid electrodes 5 are all the same.

When the silver paste 12a is printed, as illustrated in FIG. 7-1 and FIG. 7-2, the alignment mark portion 51L is printed with the silver paste 12a in the region B in the central portion in the extending direction of the left-end printed pattern 5aL. The left-end printed pattern 5aL is a comb-tooth-shaped portion located at the left end among the comb-tooth-shaped portions formed along a pair of opposing sides of the semiconductor substrate 2. The alignment mark portion 51L has a specific shape, e.g., projecting from the left-end printed pattern 5aL and has a shape corresponding to the alignment mark portion 41L of the first n-type impurity diffusion layer 3a.

When the silver paste 12a is printed, as illustrated in FIG. 7-1 and FIG. 7-2, the alignment mark portion 51R is printed with the silver paste 12a in the region D in the central portion in the extending direction of the right-end printed pattern 5aR. The right-end printed pattern 5aR is a comb-tooth-shaped portion located at the right end among the comb-tooth-shaped portions formed along a pair of opposing sides of the semiconductor substrate 2. The alignment mark portion 51R has a specific shape, e.g., projecting from the right-end printed pattern 5aR and has a shape corresponding to the alignment mark portion 41R of the first n-type impurity diffusion layer 3a.

The silver paste 12a is printed in a state where the position (print position of the silver paste 12a) of the printing stage for printing the silver paste 12a is adjusted such that the position of the alignment mark portion 41L of the first n-type impurity diffusion layer 3a matches the position of the alignment mark portion 51L corresponding to the alignment mark portion 35L and the position of the alignment mark portion 41R of the first n-type impurity diffusion layer 3a matches the position of the alignment mark portion 51R corresponding to the alignment mark portion 35R.

At this point in time, the point at which the silver paste 12a and the first n-type impurity diffusion layer 3a are superposed on each other with the highest accuracy is referred to as the positioning reference point. In other words, the positioning reference point is a position at which a positional accuracy in the width direction of the light-receiving-surface-side electrodes between the lower-layer portions and the upper-layer portions is highest. In the present embodiment, an alignment mark is provided in each of the region B in the central portion in the extending direction of the left-end printed pattern 5aL and the region D in the central portion in the extending direction of the right-end printed pattern 5aR; therefore, the central portion within the surface of the semiconductor substrate 11 is the positioning reference point. In FIG. 7-1, the positioning reference point is indicated by a cross mark.

The printing mask used for printing the silver paste 12a is a printing mask that has a plurality of opening patterns disposed in parallel at equal intervals. The opening patterns have the same width that is smaller than the width of the first n-type impurity diffusion layer 3a that is closest to the positioning reference point in the width direction of the first n-type impurity diffusion layer 3a. The first n-type impurity diffusion layer 3a that is closest to the positioning reference point in the width direction of the first n-type impurity diffusion layer 3a and the opening pattern corresponding to the position of that first n-type impurity diffusion layer 3a are aligned with the highest accuracy.

The first n-type impurity diffusion layer 3a portion and the print position of the silver paste 12a are aligned with reference to the positioning reference point (they are superposed with high accuracy near the positioning reference point). Therefore, even when extension, distortion, or the like occurs in the printing mask used for printing the silver paste 12a, printing misalignment does not occur near the positioning reference point because the printing accuracy is high near the positioning reference point.

The print position of the silver paste 12a is gradually displaced as it becomes further away from the positioning reference point; therefore, printing misalignment occurs. Thus, the first n-type impurity diffusion layer 3a that is located away from the positioning reference point has a certain width such that the silver paste 12a does not protrude from the first n-type impurity diffusion layer 3a during the printing process of the silver paste 12a. In other words, the comb-tooth-shaped portions in the pattern of the first n-type impurity diffusion layer 3a are such that the comb-tooth-shaped patterns get thicker as they get further away from the positioning reference point.

Because the printing accuracy of the silver paste 12a is high at a position near the positioning reference point, the width of the first n-type impurity diffusion layer 3a is made smaller near the positioning reference point. Accordingly, the area occupied by the first n-type impurity diffusion layer 3a (high-concentration impurity diffusion layer) in the n-type impurity diffusion layer 3 is reduced. Therefore, the recombination of electrons in the semiconductor substrate 11 can be reduced and thus the electrical properties of the solar cell can be improved. In the present embodiment, as described above, for example, the width "a" of the left-end first n-type impurity diffusion layer 3aL and the right-end first n-type impurity diffusion layer 3aR, which are furthest from the positioning reference point in the width direction of the surface silver grid electrodes 5, is 200 micrometers and the width "b" of the central first n-type impurity diffusion layer 3aC closest to the positioning reference point is 120 micrometers.

As described above, the pattern of the silver paste 12a is printed such that it is superposed on the n-type impurity diffusion layer 3. Even when the printing mask used for printing the silver paste 12a has a printing misalignment amount "d" of, for example, 50 micrometers because of its extension, distortion, or the like, the left-end printed pattern 5aL and the right-end printed pattern 5aR having a width of 100 micrometers are printed without protruding from the left-end first n-type impurity diffusion layer 3aL and the right-end first n-type impurity diffusion layer 3aR, which are furthest from the positioning reference point and have a width of 200 micrometers.

In such a manner, the area of the first n-type impurity diffusion layer 3a (high-concentration impurity diffusion layer) near the positioning reference point can be reduced without causing printing misalignment of even the surface silver grid electrode 5 located away from the positioning reference point in the width direction of the surface silver grid electrodes 5 from the first n-type impurity diffusion layer 3a. Therefore, in addition to the improvement of the properties due to the selective emitter structure, the properties can be further improved and the cost of forming the first n-type impurity diffusion layer 3a (high-concentration impurity diffusion layer) can be reduced.

In other words, by preventing printing misalignment of the surface silver grid electrodes 5 from the first n-type impurity diffusion layer 3a from occurring, an increase is prevented in the contact resistance between the light-receiving-surface-side electrode 12 and the semiconductor substrate 11 (the n-type impurity diffusion layer 3) due to the light-receiving-surface-side electrode 12 protruding from the first n-type impurity diffusion layer 3a and overlapping with the second n-type impurity diffusion layer 3b and thus the properties of the solar cell are prevented from being reduced. Therefore, the photoelectric conversion efficiency of the solar cell 1 can be improved. Printing misalignment of the surface silver grid electrodes 5 from the first n-type impurity diffusion layer 3a causes an increase in the area of the unnecessary first n-type impurity diffusion layer 3a (high-concentration impurity diffusion layer) that does not contribute to the improvement of the conductivity with the surface silver grid electrodes 5 and that causes an increase in the recombination of electrons in the semiconductor substrate 11.

Moreover, by reducing the area of the first n-type impurity diffusion layer 3a (high-concentration impurity diffusion layer) near the positioning reference point, the area occupied by the first n-type impurity diffusion layer 3a (high-concentration impurity diffusion layer) in the n-type impurity diffusion layer 3 is reduced. Therefore, the recombination of electrons in the semiconductor substrate 11 can be reduced and thus the electrical properties of the solar cell can be improved.

Thereafter, by firing the electrode pastes on the front and back surfaces of the semiconductor substrate 11 at the same time, on the front side of the semiconductor substrate 11, the silver material comes into contact with silicon and is re-solidified while the anti-reflective film 4 is melting by the glass material contained in the silver paste. Accordingly, the surface silver grid electrodes 5 and the surface silver bus electrodes 6, which form the light-receiving-surface-side electrode 12, are obtained and thus the light-receiving-surface-side electrode 12 and the n-type impurity diffusion layer 3 are electrically connected to each other (FIG. 2-9). Such a process is referred to as a fire-through method. Therefore, the n-type impurity diffusion layer 3 can have an excellent resistive junction with the light-receiving-surface-side electrode 12. Firing is performed, for example, at 750° C. to 800° C. or higher by using an infrared heating furnace.

On the back surface side of the semiconductor substrate 11, the aluminum paste 7a and the silver paste 8a are fired; therefore, the back aluminum electrode 7 and the back silver electrode 8 are formed, and furthermore, the connection portions of the back aluminum electrode 7 and the back silver electrode 8 are formed as an alloy portion. Concurrently with this, the aluminum paste 7a is also alloyed with silicon on the back surface of the semiconductor substrate 11 and, during the re-solidification process thereof, a BSF layer (not illustrated) containing aluminum as a dopant is formed immediately under the back aluminum electrode 7. Accordingly, the n-type impurity diffusion layer 3 formed on the back surface side of the semiconductor substrate 11 is inverted to a p-type layer; therefore, the pn junction on the back surface of the semiconductor substrate 11 can be nullified.

Figures 2, 3, 4, 5, 6, 7, 8:
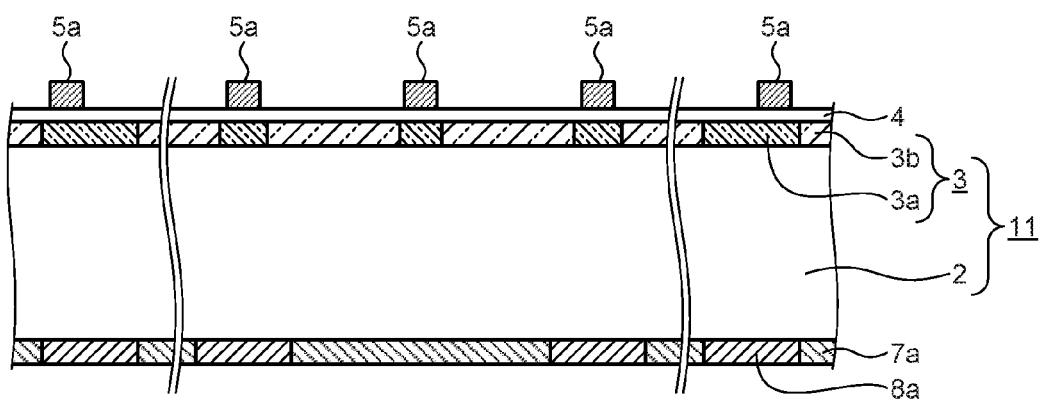

The method for determining the positioning reference point is not limited to the example described above. For example, as illustrated in FIG. 8-1 and FIG. 8-2, an alignment mark portion may be provided in the first n-type impurity diffusion layer 3a that is on one end side in the width direction (X direction in FIG. 8-1) of the comb-shaped first n-type impurity diffusion layer 3a and in the first n-type impurity diffusion layer 3a other than that on the end portion side in the width direction (X direction in FIG. 8-1) of the comb-shaped first n-type impurity diffusion layer 3a. In the printed pattern of the silver paste 5a for forming the surface silver grid electrodes 5, alignment mark portions are provided at the positions corresponding to the alignment mark portions of the first n-type impurity diffusion layer 3a.

FIG. 8-1 is a plan view illustrating another state where the first n-type impurity diffusion layer 3a is formed on one surface side of the semiconductor substrate 2. FIG. 8-2 is an enlarged view illustrating the relevant parts in a region E, a region F, a region G, and a region H in FIG. 8-1. In FIG. 8-2, (a) illustrates the region E, (b) illustrates the region F, (c) illustrates the region G, and (d) illustrates the region H in an enlarged scale. FIG. 8-3 is a plan view illustrating a state where the silver paste 5a is printed in the region H in FIG. 8-1. As illustrated in FIG. 8-1, the pattern of the first n-type impurity diffusion layer 3a on one surface side of the semiconductor substrate 2 corresponds to the printed pattern (comb-shaped) of the n-type doping paste 21 on one surface side of the semiconductor substrate 2.

As illustrated in FIG. 8-1 and FIG. 8-2, an alignment mark portion 42La and an alignment mark portion 42Lb of the first n-type impurity diffusion layer 3a are formed in the left-end first n-type impurity diffusion layer 3aL. An alignment mark portion 42L3 of the first n-type impurity diffusion layer 3a is formed in a comb-tooth-shaped first n-type impurity diffusion layer 3aL3, which is located third from the left in the width direction (X direction in FIG. 8-1) of the comb-shaped first n-type impurity diffusion layer 3a. In this case, the lower left portion of the semiconductor substrate 2 in FIG. 8-1 is the positioning reference point.

Other comb-tooth-shaped portions in the pattern of the first n-type impurity diffusion layer 3a are such that the comb-tooth-shaped patterns get thinner as they get closer in the X direction in FIG. 8-1 to the left-end first n-type impurity diffusion layer 3aL. Therefore, a width "f" of the right-end first n-type impurity diffusion layer 3aR is the largest. A width "e" of the left-end first n-type impurity diffusion layer 3aL is the smallest.

In this case, for example, the width "e" of the left-end first n-type impurity diffusion layer 3aL closest to the positioning reference point in the width direction (X direction in FIG. 8-1) of the comb-shaped first n-type impurity diffusion layer 3a is 120 micrometers, and the width "f" of the right-end first n-type impurity diffusion layer 3aR furthest from the positioning reference point is 200 micrometers. Even when the printing mask used for printing the silver paste 12a has a printing misalignment amount "g" of, for example, 50 micrometers because of its extension, distortion, or the like, the right-end printed pattern 5aR having a width of 100 micrometers is printed without protruding from the right-end first n-type impurity diffusion layer 3aR, which is furthest from the positioning reference point and has a width of 200 micrometers.

As described above, in the first embodiment, the first n-type impurity diffusion layer 3a that is located away from the positioning reference point in the width direction of the surface silver grid electrodes 5 has a width with a certain margin such that the silver paste 12a does not protrude from the first n-type impurity diffusion layer 3a during the printing process of the silver paste 12a. In other words, the comb-tooth-shaped portions in the pattern of the first n-type impurity diffusion layer 3a are such that the comb-tooth-shaped patterns get thicker as they get further away from the positioning reference point. Because the printing accuracy of the silver paste 12a is high at a position near the positioning reference point, the width of the first n-type impurity diffusion layer 3a is made smaller near the positioning reference point. Accordingly, the area of the first n-type impurity diffusion layer 3a (high-concentration impurity diffusion layer) near the positioning reference point can be reduced without causing printing misalignment of the surface silver grid electrode 5 located away from the positioning reference point in the width direction of the surface silver grid electrodes 5. Therefore, in addition to the improvement of the properties due to the selective emitter structure, the properties can be further improved and the cost of forming the first n-type impurity diffusion layer 3a (high-concentration impurity diffusion layer) can be reduced.

Therefore, according to the first embodiment, a solar cell is obtained in which a reduction in the photoelectric conversion efficiency due to the printing misalignment of the light-receiving-surface-side electrode is prevented and that has excellent photoelectric conversion efficiency.

Second Embodiment

The above first embodiment has described the case where an electrode paste is printed on the n-type impurity diffusion layer (high-concentration impurity diffusion layer) portion in a selective emitter structure to form a light-receiving-surface-side electrode without causing printing misalignment. The second embodiment will describe a case where an electrode having a multilayered structure is formed by printing an electrode paste a plurality of times in a superposed manner.

In this case, during the printing process of a silver paste for forming the light-receiving-surface-side electrode, the silver paste is printed a plurality of times in a superposed manner. In the present embodiment, an explanation will be given of a case where the silver paste is printed twice during the printing process of the silver paste for forming the light-receiving-surface-side electrode.

Figures 2, 3, 4, 5, 6, 7, 8, 9:
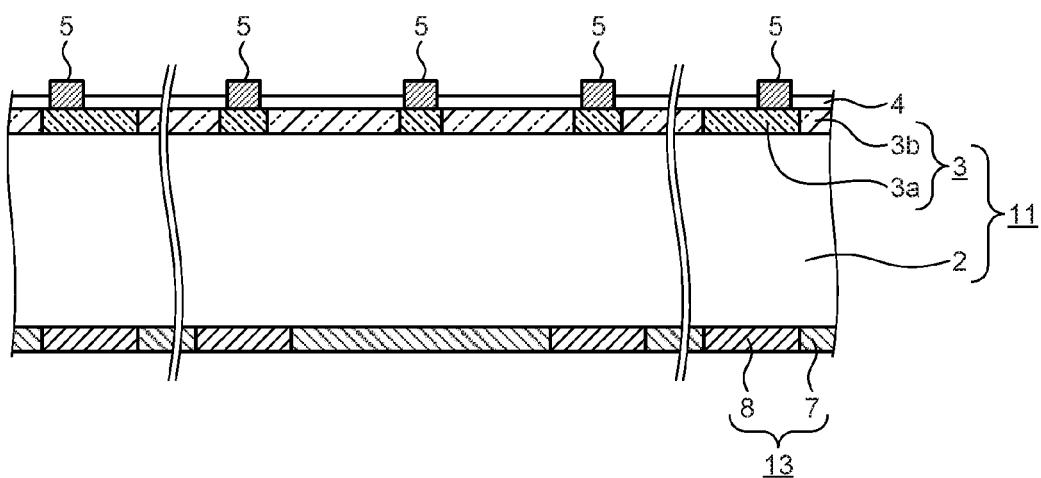
Figures 1, 3:
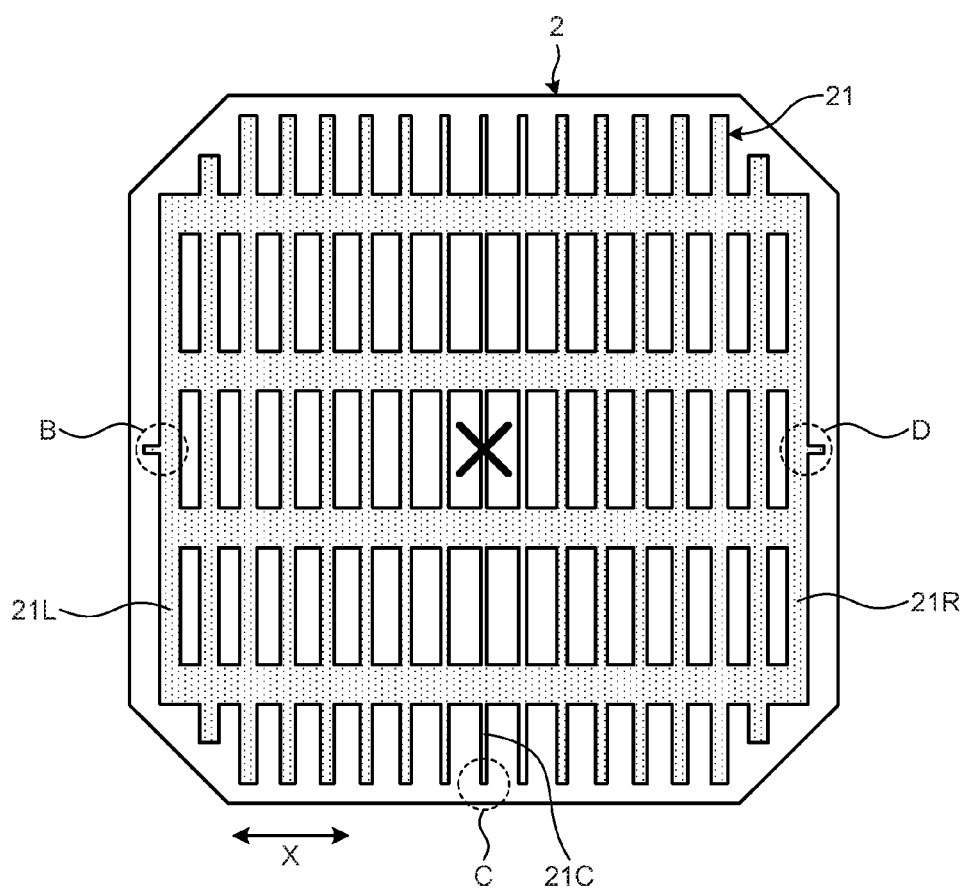
Figures 2, 3:
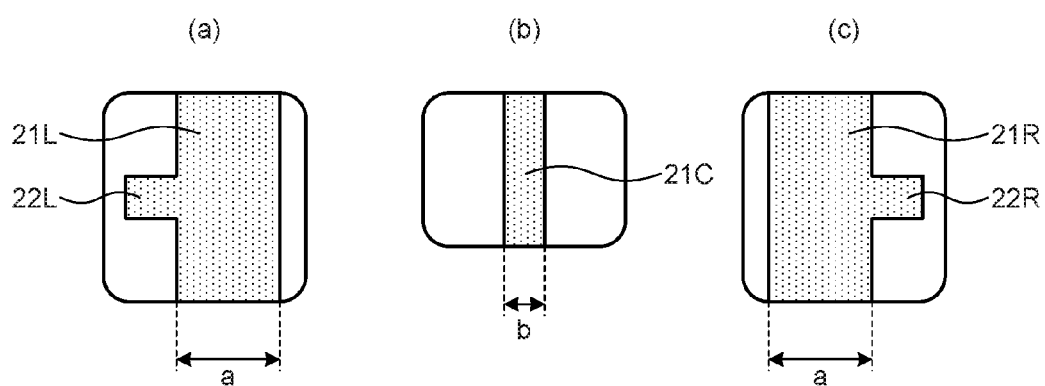
Figure 4:
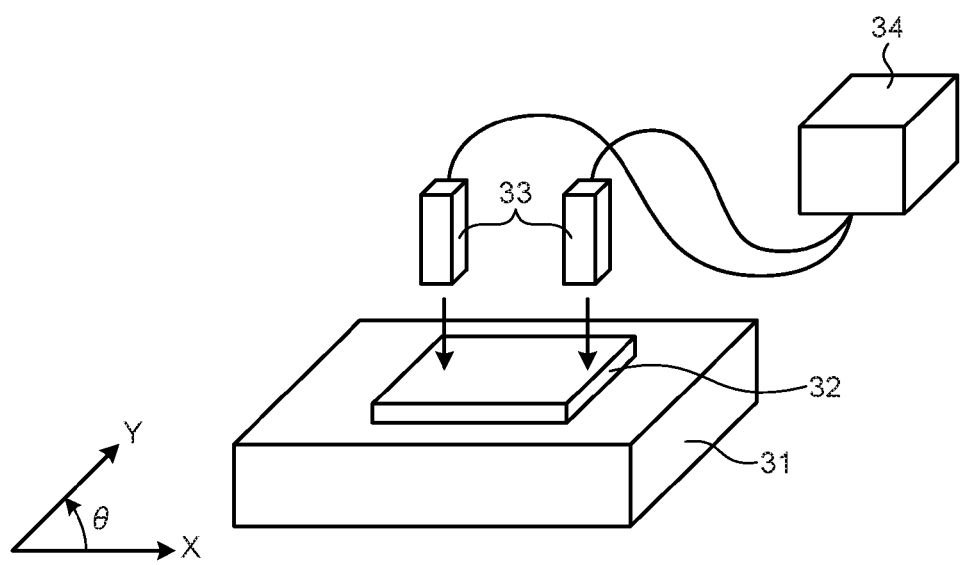
Figure 5:
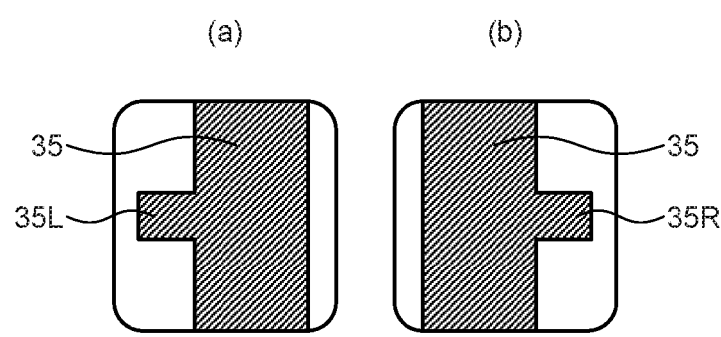
Figures 1, 6:
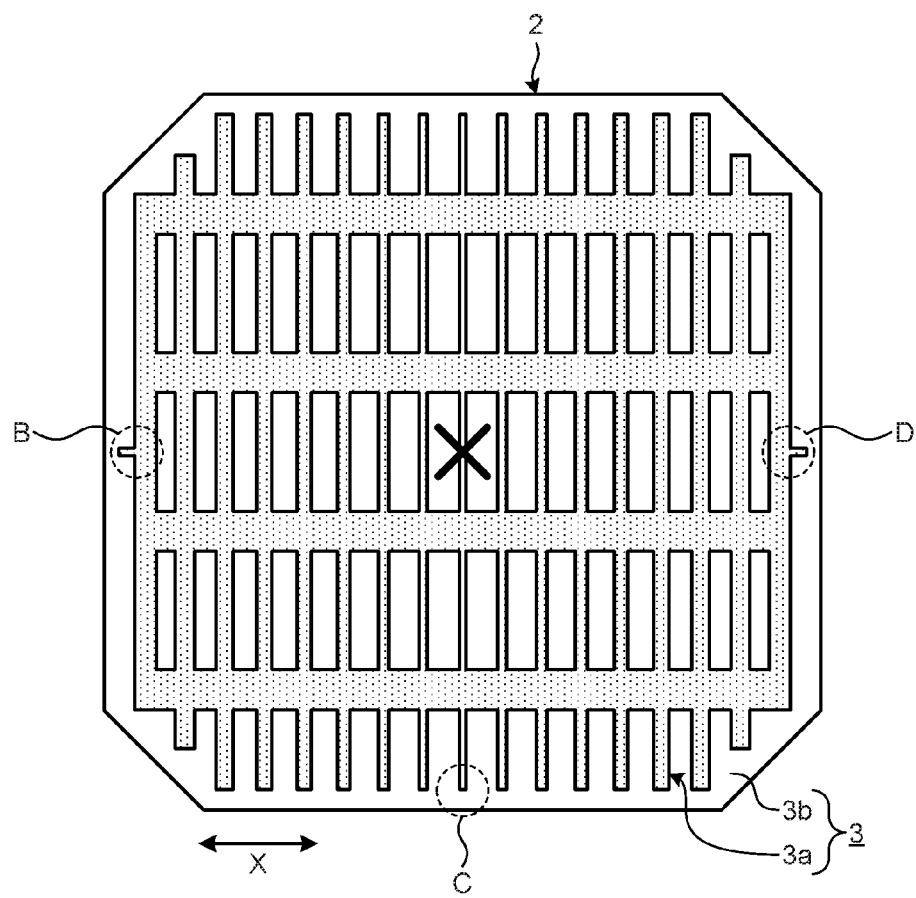
Figures 2, 6:
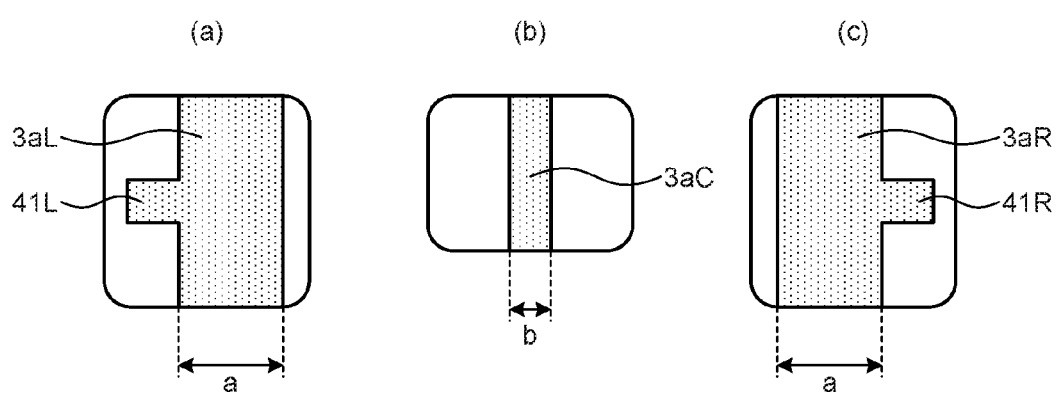
Figures 1, 7:
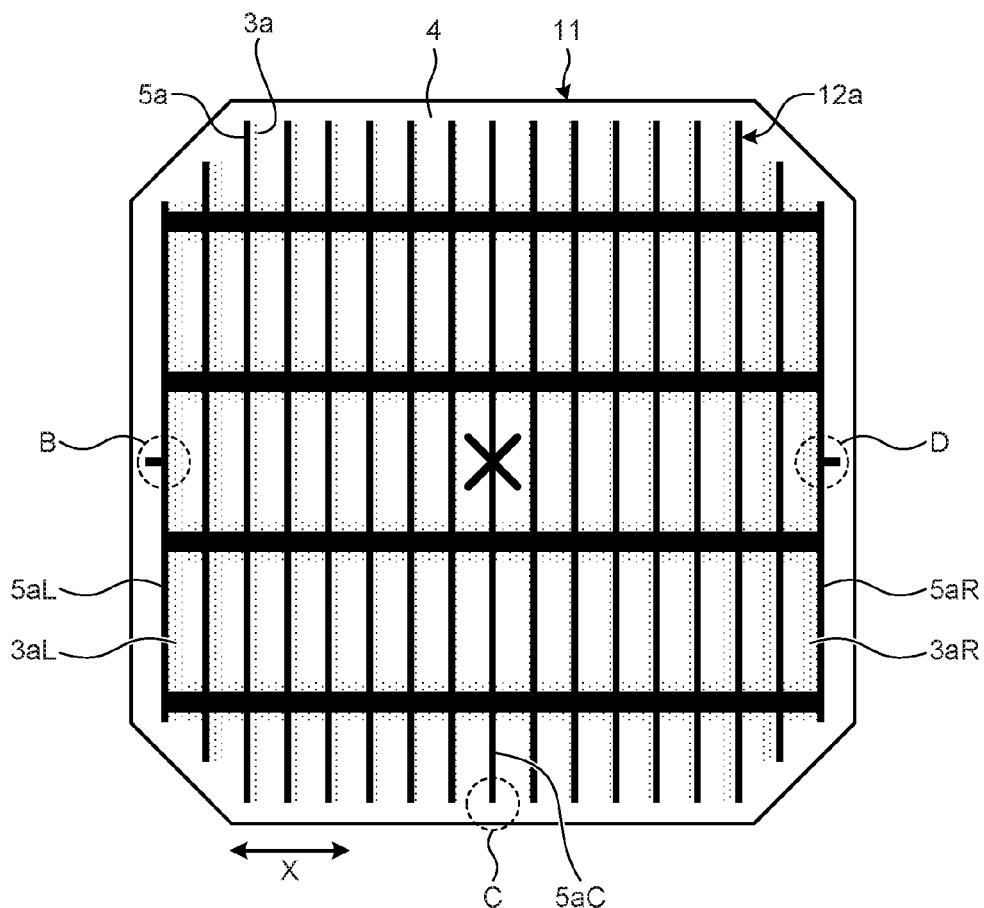
Figures 2, 7:
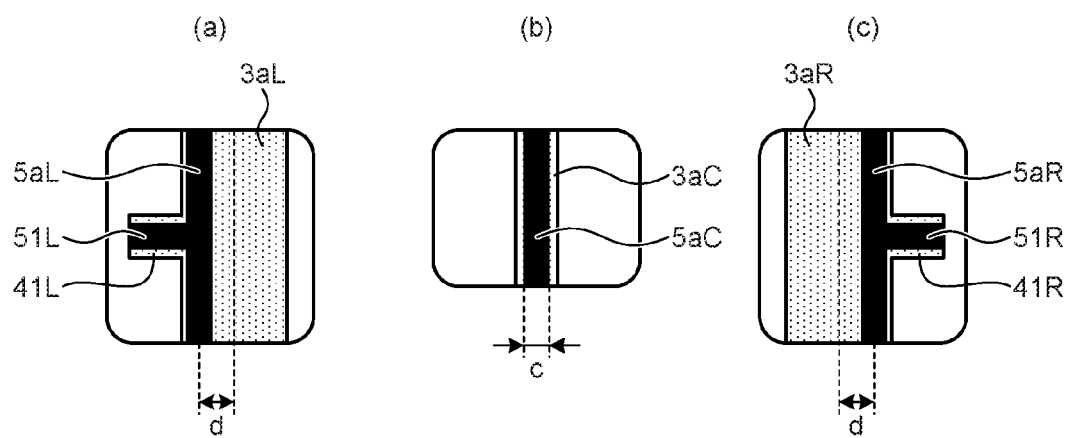
Figures 1, 8:
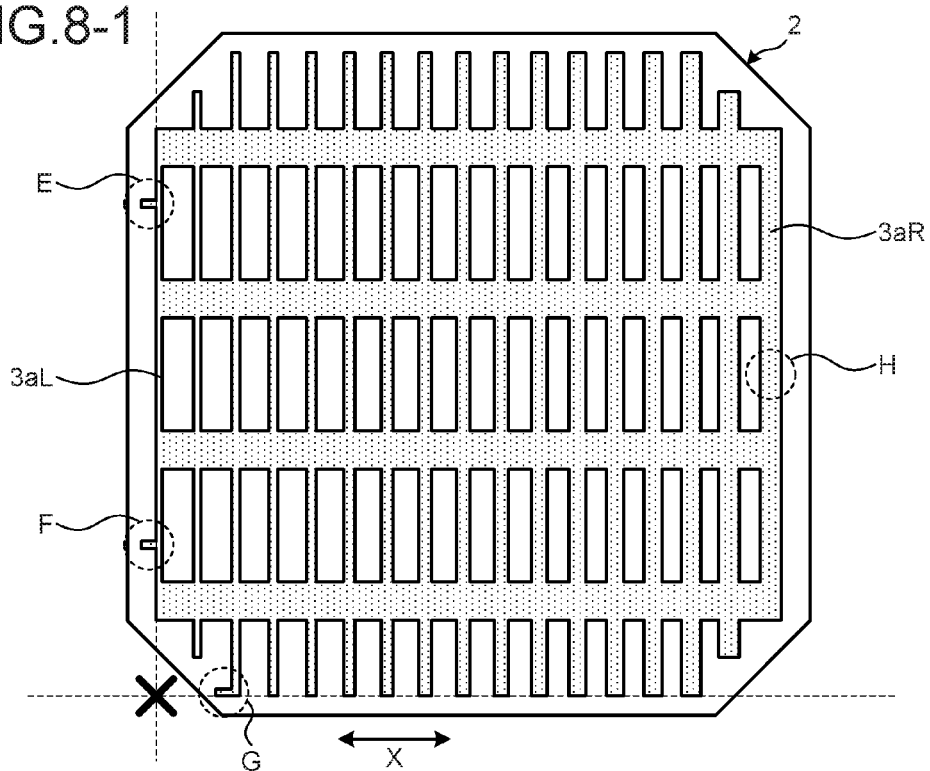
Figures 2, 8:
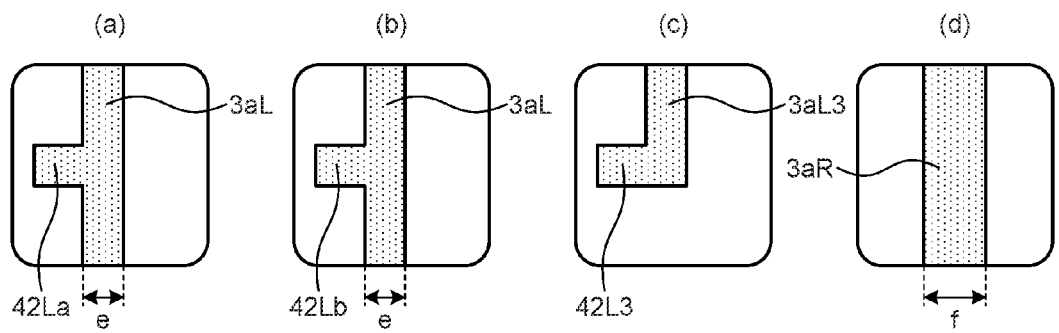
Figures 3, 8:
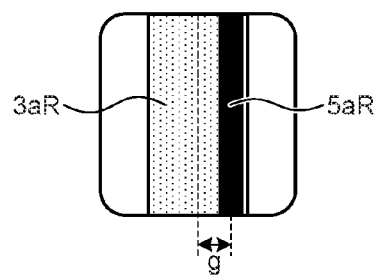
Figures 1, 9:
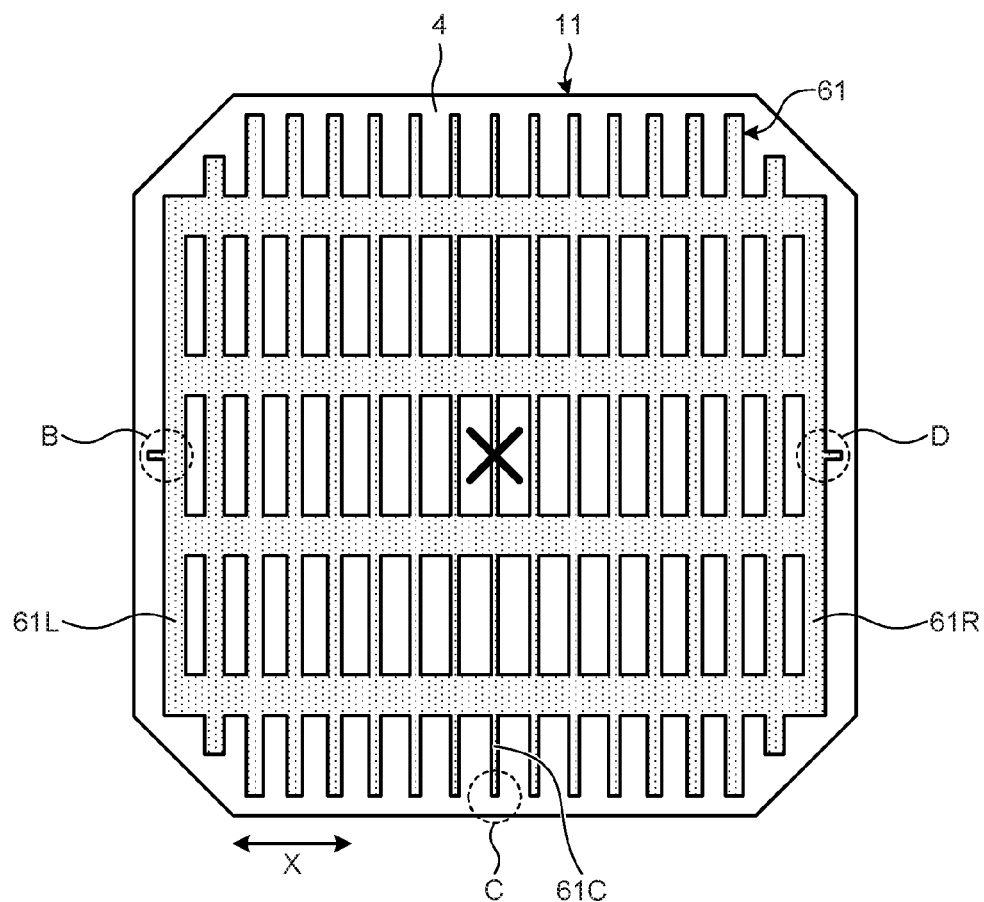
Figures 2, 9:
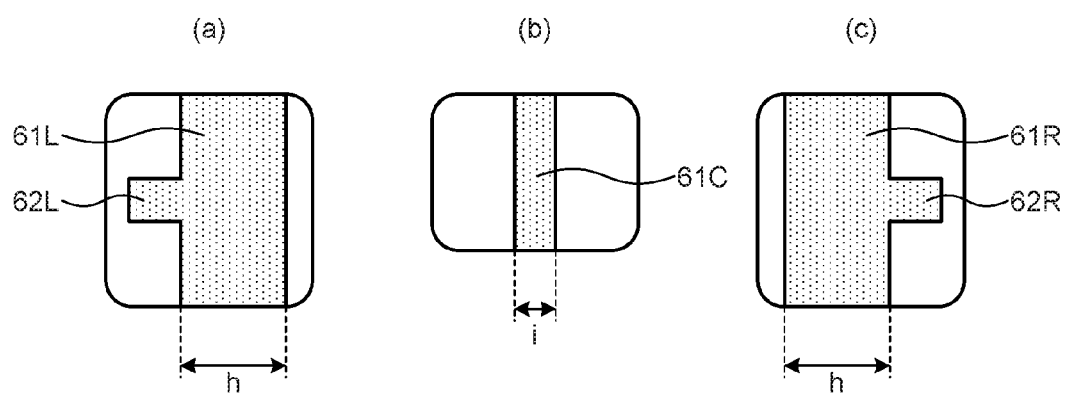

First, the processes up to the process illustrated in FIG. 2-7 in the first embodiment described above are performed. The n-type impurity diffusion layer 3 is formed by diffusing phosphorus by thermal diffusion at a high temperature in phosphorus oxychloride (POCl$_3$) gas by using a vapor-phase diffusion method such that the concentration of the n-type impurity element is uniform. Next, a silver paste 61 of the first layer is applied, by screen printing, to the anti-reflective film 4 on the light receiving surface of the semiconductor substrate 11, and thereafter, the silver paste 61 of the first layer is dried. The printed pattern of the silver paste 61 of the first layer has a shape corresponding to the shape of the surface silver grid electrodes 5 and the surface silver bus electrodes 6 in a similar manner to the case of the first embodiment. FIG. 9-1 is a plan view illustrating a state where the silver paste 61 of the first layer is printed on one surface side of the semiconductor substrate 11. FIG. 9-2 is an enlarged view illustrating the relevant parts in the region B, the region C, and the region D in FIG. 9-1. In FIG. 9-2, (a) illustrates the region B, (b) illustrates the region C, and (c) illustrates the region D in an enlarged scale.

At this point in time, the silver paste 61 of the first layer is printed such that the printed pattern thereof and the printing method for printing it are similar to those when the n-type doping paste 21 is printed in the first embodiment described above. In other words, the comb-tooth-shaped printed patterns get thinner as they get closer in the X direction in FIG. 9-1 to a comb-tooth-shaped printed pattern 61C (hereinafter, sometimes referred to as a central printed pattern 61C) of the silver paste of the first layer located in the center in the X direction. Therefore, the printing width of a comb-tooth-shaped printed pattern 61L (hereinafter, sometimes referred to as a left-end printed pattern 61L) of the silver paste of the first layer located at the left end in the X direction in FIG. 9-1 and a comb-tooth-shaped printed pattern 61R (hereinafter, sometimes referred to as a right-end printed pattern 61R) of the silver paste of the first layer located at the right end in the X direction are the largest. In other words, a width "h" of the left-end printed pattern 61L and the right-end printed pattern 61R is the largest. A width "i" of the central printed pattern 61C is the smallest. Then, after the silver paste 61 of the first layer is printed, the silver paste 61 of the first layer is dried.

In the printed pattern of the silver paste 61 of the first layer, as illustrated in FIG. 9-1 and FIG. 9-2, an alignment mark portion 62L is printed with the silver paste 61 of the first layer in the region B in the central portion in the extending direction of the left-end printed pattern 61L located at the left end in the X direction in FIG. 9-1. The alignment mark portion 62L is printed with the silver paste 61 of the first layer in a specific shape, for example, projecting from the left-end printed pattern 61L.

In the printed pattern of the silver paste 61 of the first layer, as illustrated in FIG. 9-1 and FIG. 9-2, an alignment mark portion 62R is printed with the silver paste 61 of the first layer in the region D in the central portion in the extending direction of the right-end printed pattern 61R located at the right end in the X direction in FIG. 9-1. The alignment mark portion 62R is printed with the silver paste 61 of the first layer in a specific shape, for example, projecting from the right-end printed pattern 61R.

The alignment mark portion 62L and the alignment mark portion 62R are used for accurately superposing a silver paste 63 of the second layer on the silver paste 61 of the first layer in the subsequent printing process of the silver paste 63 of the second layer.

Figures 1, 10:
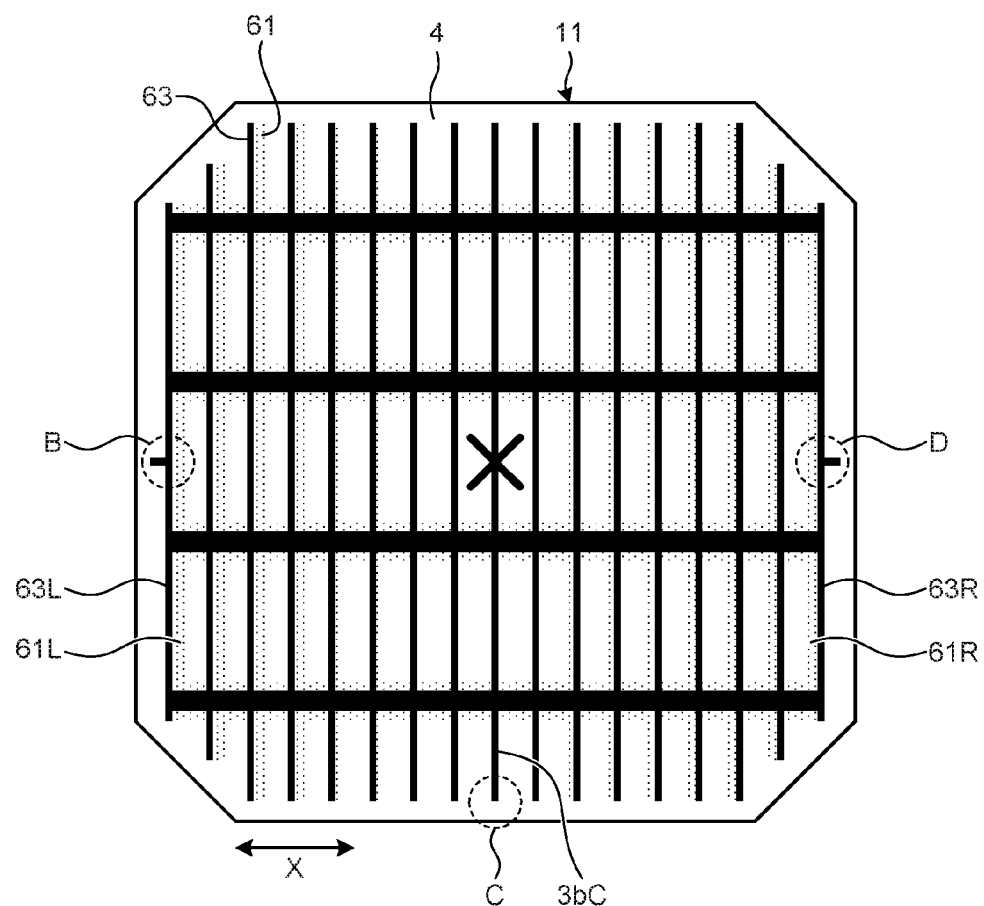
Figures 2, 10:
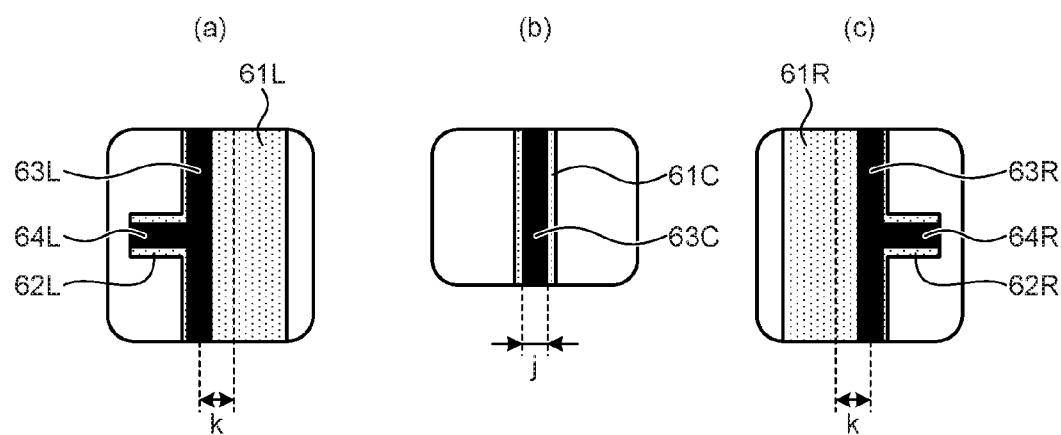

Next, the silver paste 63 of the second layer is printed. FIG. 10-1 is a plan view illustrating a state where the silver paste 63 of the second layer is printed on one surface side of the semiconductor substrate 11. FIG. 10-2 is an enlarged view illustrating the relevant parts in the region B, the region C, and the region D in FIG. 10-1. In FIG. 10-2, (a) illustrates the region B, (b) illustrates the region C, and (c) illustrates the region D in an enlarged scale. When the silver paste 63 of the second layer is printed, an alignment mark portion 64L is printed with the silver paste 63 of the second layer in the region B in the central portion in the extending direction of a comb-tooth-shaped printed pattern 63L (hereinafter, sometimes referred to as a left-end printed pattern 63L) of the silver paste of the second layer located at the left end in the X direction in FIG. 10-1. The alignment mark portion 64L has a specific shape, for example, projecting from the left-end printed pattern 63L and has a shape corresponding to the alignment mark portion 62L of the left-end printed pattern 61L.

When the silver paste 63 of the second layer is printed, an alignment mark portion 64R is printed with the silver paste 63 of the second layer in the region D in the central portion in the extending direction of a comb-tooth-shaped printed pattern 63R (hereinafter, sometimes referred to as a right-end printed pattern 63R) of the silver paste of the second layer located at the right end in the X direction in FIG. 10-1. The alignment mark portion 64R has a specific shape, for example, projecting from the right-end printed pattern 63R and has a shape corresponding to the alignment mark portion 62R of the right-end printed pattern 61R.

The silver paste 63 of the second layer is printed such that the printed pattern thereof and the printing method for printing it are similar to those when the silver paste 12a is printed in the first embodiment described above. In other words, the silver paste 63 of the second layer is printed such that the alignment mark of the silver paste 63 of the second layer matches the alignment mark of the silver paste 61 of the first layer. Specifically, the position (print position of the silver paste 63 of the second layer) of the printing stage for printing the silver paste 63 of the second layer is adjusted such that the position of the alignment mark portion 62L matches the position of the alignment mark portion 64L and the position of the alignment mark portion 62R matches the position of the alignment mark portion 64R. At this point in time, the positioning reference point, at which the silver paste 61 of the first layer and the silver paste 63 of the second layer are superposed on each other with the highest accuracy, is the central portion within the surface of the semiconductor substrate 11. In FIG. 10-1, the positioning reference point is indicated by a cross mark.

The printing mask used for printing the silver paste 63 of the second layer is a printing mask that has a plurality of opening patterns disposed in parallel at equal intervals. The opening patterns have the same width that is smaller than the width of the pattern of the silver paste 61 of the first layer that is closest to the positioning reference point in the width direction of the surface silver grid electrodes 5. The pattern of the silver paste 61 of the first layer that is closest to the positioning reference point in the width direction of the surface silver grid electrodes 5 and the opening pattern corresponding to the position of the pattern of that silver paste 61 of the first layer are aligned with the highest accuracy.

The comb-tooth-shaped portions in the printed pattern of the silver paste 63 of the second layer are also printed on the comb-shaped silver paste 61 of the first layer in a similar manner. The pattern of the silver paste 63 for forming the surface silver bus electrodes 6 is also printed on the corresponding silver paste 61 of the first layer. The silver paste 63 of the second layer for the surface silver grid electrodes is printed such that it has a uniform printing width "j". The silver paste 63 of the second layer for the surface silver grid electrodes 5 is printed such that the printing intervals in the silver paste 63 are all the same.

The printed portion of the silver paste 61 of the first layer and the print position of the silver paste 63 of the second layer are aligned with reference to the positioning reference point (they are superposed with high accuracy near the positioning reference point). Therefore, even when extension, distortion, or the like occurs in the printing mask used for printing the silver paste 63 of the second layer, printing misalignment does not occur near the positioning reference point because the printing accuracy is high near the positioning reference point.

The print position of the silver paste 63 of the second layer is gradually displaced as it becomes further away from the positioning reference point; therefore, printing misalignment occurs. Thus, the silver paste 61 of the first layer that is located away from the positioning reference point has a certain width such that the silver paste 63 of the second layer does not protrude from the silver paste 61 of the first layer during the printing process of the silver paste 63 of the second layer. In other words, the comb-tooth-shaped portions in the pattern of the silver paste 61 of the first layer are such that the comb-tooth-shaped patterns get thicker as they get further away from the positioning reference point. Therefore, even when the printing mask for printing the silver paste of the second layer has a printing misalignment amount "k" because of its extension, distortion, or the like, the silver paste 63 of the second layer is printed without the printed portion of the silver paste 63 of the second layer protruding from the printed portion of the silver paste 61 of the first layer.

Because the printing accuracy of the silver paste 63 of the second layer is high at a position near the positioning reference point, the width of the silver paste 61 of the first layer is made smaller near the positioning reference point. Accordingly, the silver paste 63 of the second layer is printed without the printed portion of the silver paste 63 of the second layer protruding from the printed portion of the silver paste 61 of the first layer.

In such a manner, even the surface silver grid electrode 5 located away from the positioning reference point in the width direction of the surface silver grid electrodes 5 can be printed without causing printing misalignment of the printed portion of the silver paste 63 of the second layer from the printed portion of the silver paste 61 of the first layer. Accordingly, the electrode area near the positioning reference point can be reduced. Thus, a reduction in the light receiving surface area due to the light-receiving-surface-side electrode is prevented and thus the photoelectric conversion efficiency of the solar cell can be improved. Therefore, the properties of the solar cell can be improved and the cost of forming the light-receiving-surface-side electrode can be reduced.

Therefore, according to the second embodiment, a solar cell is obtained in which a reduction in the photoelectric conversion efficiency due to the printing misalignment of the light-receiving-surface-side electrode is prevented and that has excellent photoelectric conversion efficiency.

In the above description, an explanation has been given of a case where a multi-layer electrode is formed by printing an electrode paste a plurality of times in a superposed manner in a solar cell that does not have a selective emitter structure; however, this case can be applied to electrode formation of a solar cell that has a selective emitter structure according to the first embodiment.

A solar cell module having excellent photoelectric conversion efficiency can be obtained by forming a plurality of solar cells each having a configuration described in the above embodiments and electrically connecting the adjacent solar cells in series or in parallel. In such a case, for example, it is satisfactory if the light-receiving-surface-side electrode 12 of one of the adjacent solar cells and the back-surface-side electrode 13 of the other of the adjacent solar cells are electrically connected.

INDUSTRIAL APPLICABILITY

As described above, the solar cell according to the present invention is useful for obtaining a solar cell that prevents printing misalignment of an electrode from occurring and has excellent photoelectric conversion efficiency.

REFERENCE SIGNS LIST

1 solar cell, 2 semiconductor substrate, 3 n-type impurity diffusion layer, 3a first n-type impurity diffusion layer, 3aL comb-tooth-shaped pattern (left-end first n-type impurity diffusion layer) of first n-type impurity diffusion layer 3a located at the left end, 3aR comb-tooth-shaped pattern (right-end first n-type impurity diffusion layer) of first n-type impurity diffusion layer 3a located at the right end, 3aC comb-tooth-shaped pattern (central first n-type impurity diffusion layer) of first n-type impurity diffusion layer 3a located in the center, 3b second n-type impurity diffusion layer, 3aL3 comb-tooth-shaped first n-type impurity diffusion layer located third from the left, 4 anti-reflective film, 5 surface silver grid electrode, 5a silver paste, 5aC comb-tooth-shaped printed pattern (central printed pattern) of surface silver grid electrode located in the center, 5aL comb-tooth-shaped printed pattern (left-end printed pattern) of surface silver grid electrode located at the left end, 5aR comb-tooth-shaped printed pattern (right-end printed pattern) of surface silver grid electrode located at the right end, 6 surface silver bus electrode, 7 back aluminum electrode, 7a aluminum paste, 8 back silver electrode, 8a silver paste, 11 semiconductor substrate, light-receiving-surface-side electrode, 12a silver paste, 13 back-surface-side electrode, 21 n-type doping paste, 21C comb-tooth-shaped printed pattern (central printed pattern) of n-type doping paste located in the center, 21L comb-tooth-shaped printed pattern (left-end printed pattern) of n-type doping paste located at the left end, 21R comb-tooth-shaped printed pattern (right-end printed pattern) of n-type doping paste located at the right end, 22L, 22R alignment mark portion, 31 printing stage, 32 print substrate, 33 stationary camera, 34 image processing apparatus, 35 reference image, 35L, 35R, 41L, 41R, 42La, 42Lb, 42L3, 51L, 51R alignment mark portion, 61 silver paste of first layer, 61L comb-tooth-shaped printed pattern (left-end printed pattern) of silver paste of first layer located at the left end, 61R comb-tooth-shaped printed pattern (right-end printed pattern) of silver paste of first layer located at the right end, 62L, 62R alignment mark portion, 63 silver paste of second layer, 63L comb-tooth-shaped printed pattern (left-end printed pattern) of silver paste of second layer located at the left end, 63R comb-tooth-shaped printed pattern (right-end printed pattern) of silver paste of second layer located at the right end, 64L, 64R alignment mark portion, a width of left-end printed pattern 21L and right-end printed pattern 21R and width of left-end first n-type impurity diffusion layer 3aL and right-end first n-type impurity diffusion layer 3aR, b width of central printed pattern 21C and width of central first n-type impurity diffusion layer 3aC, c printing width of silver paste for surface silver grid electrode, d printing misalignment amount, e width of left-end first n-type impurity diffusion layer 3aL, f width of right-end first n-type impurity diffusion layer 3aR, g printing misalignment amount, h width of left-end printed pattern 61L and right-end printed pattern 61R, i width of central printed pattern 61C, j printing width of silver paste of second layer for surface silver grid electrode, k printing misalignment amount.

The invention claimed is:

1. A solar cell comprising:
a first-conductivity-type semiconductor substrate having a light-receiving surface side and a rear surface side opposite to the light-receiving surface side, the light-receiving surface side comprising an impurity diffusion layer having a second-conductivity-type impurity element diffused therein;
the light-receiving surface side comprising at least one bus bar extending in a first direction and a plurality of linear light-receiving-surface-side electrodes extending in a second direction, wherein the first direction is perpendicular to the second direction in a plane direction of the semiconductor substrate;
each of the plurality of linear light-receiving-surface-side electrodes is a paste electrode that has a multi-layered structure comprising a lower-layer portion and an upper-layer portion formed over the lower-layer portion and is formed by multi-layer printing of an electrode material paste on the light-receiving surface side, and is electrically connected to the impurity diffusion layer; and
a back-surface-side electrode that is formed on the rear surface side of the semiconductor substrate,
wherein the width of the plurality of linear light-receiving-surface-side electrodes decreases, relative to an adjacent linear light-receiving-surface-side electrode distal in the first direction to a single positioning reference point, in the first direction toward the single positioning reference point, the linear light-receiving-surface-side electrode of the plurality of linear light-receiving-surface-side electrodes closest to the single positioning reference point has the smallest width among any of the plurality of linear light-receiving-surface-side electrodes,
wherein each of the plurality of linear light-receiving-surface-side electrodes has a length substantially equal to the dimension of the semiconductor substrate in the second direction and a uniform cross-section along its entire length.

2. The solar cell according to claim 1, wherein the width of each adjacent lower-layer portion of the plurality of linear light-receiving-surface-side electrodes decreases, relative to an adjacent lower-layer portion distal in the first direction to the single positioning reference point, in the first direction toward the single positioning reference point,
wherein the width of the upper-layer of each of the plurality of linear light-receiving-surface-side electrodes is identical to all other upper-layers of the other linear light-receiving-surface-side electrodes.

3. The solar cell according to claim 1, wherein the single positioning reference point is a position at the lower-layer portions and the upper-layer portions of each of the plurality of linear light-receiving-surface-side electrodes are most aligned.

4. A manufacturing method of a solar cell comprising:
a first step forming a first-conductivity-type semiconductor substrate having a light-receiving surface side and a rear surface side opposite to the light-receiving surface side, the light-receiving surface side comprising an impurity diffusion layer formed by diffusing a second-conductivity-type impurity element into the one surface side of the semiconductor substrate;
the light-receiving surface side comprising at least one bus bar extending in a first direction and a plurality of linear light-receiving-surface-side electrodes extending in a second direction, wherein the first direction is perpendicular to the second direction in a plane direction of the semiconductor substrate;
a second step forming each of the plurality of linear light-receiving-surface-side electrodes is a paste electrode that has a multi-layered structure comprising a lower-layer portion and an upper-layer portion formed over the lower-layer portion and is formed by multi-layer screen printing of an electrode material paste on the light-receiving surface side, and is electrically connected to the impurity diffusion layer;
a third step forming a back-surface-side electrode on the rear surface side of the semiconductor substrate, wherein the second step includes
  printing a lower-layer electrode material paste during the multi-layer screen printing with a plurality of printed patterns each having a width that decreases, relative to an adjacent printed pattern distal in the first direction to a single positioning reference point, in the first direction toward the single positioning reference point, and
  printing, by using a printing mask that has a plurality of opening patterns disposed in parallel at equal intervals in the first direction, an upper-layer electrode material paste during the multi-layer screen printing on the printed patterns of the lower-layer electrode material paste such that a printed pattern of the lower-layer electrode material paste that is closest to the single positioning reference point in the first direction and an opening pattern corresponding to a position of the printed pattern are aligned with each other, the opening patterns having a same width that is smaller than a width of the printed pattern of the lower-layer electrode material paste that is closest to the single positioning reference point in the first direction,
wherein the width of at least one of the upper-layer portion and the lower-layer portion of each of the plurality of linear light-receiving-surface-side electrodes decreases, relative to an adjacent linear light-receiving-surface-side electrode distal in the first direction to a single positioning reference point, in the first direction toward the single positioning reference point,
the linear light-receiving-surface-side electrode of the plurality of linear light-receiving-surface-side electrodes closest to the single positioning reference point has the smallest width among any of the plurality of linear light-receiving-surface-side electrodes,
wherein each of the plurality of linear light-receiving-surface-side electrodes has a length substantially equal to the dimension of the semiconductor substrate in the second direction and a uniform cross-section along its entire length.

5. The manufacturing method of a solar cell according to claim 4, wherein the second step includes:
  printing, when the lower-layer electrode material paste is printed, first alignment mark portions for positioning at a plurality of predetermined locations in the printed patterns of the lower-layer electrode material paste, and
  printing, when the upper-layer electrode material paste is printed, the upper-layer electrode material paste such that second alignment mark portions for positioning are aligned with the first alignment mark portions at corresponding positions, the second alignment mark portions being provided at a plurality of predetermined locations corresponding to positions of the first alignment mark portions in a printed pattern of the upper-layer electrode material paste, and the single positioning reference point is a position where the printed patterns of lower-layer portions and the opening patterns upper-layer portions of each of the plurality of linear light-receiving-surface-side electrodes are most aligned when the first alignment mark portions and the second alignment mark portions are aligned with each other.

6. A solar cell module comprising at least two solar cells according to claim 1 that are electrically connected in series or in parallel.

* * * * *